(12) United States Patent  
Marks et al.

(10) Patent No.: US 7,910,932 B2  
(45) Date of Patent: Mar. 22, 2011

(54) TRANSPARENT NANOWIRE TRANSISTORS AND METHODS FOR FABRICATING SAME

(75) Inventors: Tobin J. Marks, Evanston, IL (US); David B. Janes, West Lafayette, IN (US); Sanghyun Ju, Seoul (KR); Peide Ye, West Lafayette, IN (US); Chongwu Zhou, Arcadia, CA (US); Antonio Facchetti, Chicago, IL (US)

(73) Assignees: Northwestern University, Evanston, IL (US); Purdue Research Foundation, West Lafayette, IN (US); University of Southern California, Los Angeles, CA (US)

( * ) Notice: Subject to any disclaimer, the term of this patent is extended or adjusted under 35 U.S.C. 154(b) by 67 days.

(21) Appl. No.: 12/131,697

(22) Filed: Jun. 2, 2008

(65) Prior Publication Data

US 2009/0050876 A1    Feb. 26, 2009

Related U.S. Application Data

(60) Provisional application No. 60/932,636, filed on Jun. 1, 2007.

(51) Int. Cl.  
   *H01L 27/14* (2006.01)

(52) U.S. Cl. .................................. 257/72; 257/E29.07

(58) Field of Classification Search ............ 257/72, 257/613, E29.07; 977/762; 438/158  
See application file for complete search history.

(56) References Cited

U.S. PATENT DOCUMENTS

| | | | |
|---|---|---|---|
| 5,156,918 A | 10/1992 | Marks et al. | |
| 6,459,685 B1 | 10/2002 | Mahe | |
| 6,855,274 B1 | 2/2005 | Marks et al. | |
| 6,863,943 B2 | 3/2005 | Wang et al. | |
| 7,151,281 B2 * | 12/2006 | Shei et al. | 257/79 |
| 7,233,041 B2 * | 6/2007 | Duan et al. | 257/296 |
| 7,405,129 B2 * | 7/2008 | Afzali-Ardakani et al. | 438/289 |
| 2002/0090738 A1 | 7/2002 | Cozzette et al. | |
| 2004/0031975 A1 | 2/2004 | Kern et al. | |
| 2004/0105810 A1 | 6/2004 | Ren et al. | |
| 2006/0003485 A1 | 1/2006 | Hoffman et al. | |
| 2006/0169788 A1 | 8/2006 | Empedocles et al. | |

FOREIGN PATENT DOCUMENTS

WO    WO2008089401    7/2008

OTHER PUBLICATIONS

Ju et al. "Fabrication of fully transparent nanowire transistors for transparent and flexible electronics," Nature Nanotechnology, vol. 2, pp. 378-384, Jun. 2007, entire document.

Xu et al. "Fabrication and photoluminescence of Zinc silicate/silica modulated ZnO nanowires," Nanotechnology, vol. 16, No. 12, pp. 2808-2812, Dec. 2005, entire document.

(Continued)

*Primary Examiner* — Mark Prenty  
(74) *Attorney, Agent, or Firm* — Reinhart Boerner Van Deuren s.c.

(57) ABSTRACT

Disclosed are fully transparent nanowire transistors having high field-effect mobilities. The fully transparent nanowire transistors disclosed herein include one or more nanowires, a gate dielectric prepared from a transparent inorganic or organic material, and transparent source, drain, and gate contacts fabricated on a transparent substrate. The fully transparent nanowire transistors disclosed herein also can be mechanically flexible.

27 Claims, 14 Drawing Sheets  
(14 of 14 Drawing Sheet(s) Filed in Color)

OTHER PUBLICATIONS

Li, C., Zhang, D., Han, S., Liu, X., Tang, T., Zhou, C. "Diameter-Controlled Growth of Single-Crystalline In2O3 Nanowires and Their Electronic Properties." Adv. Mater. 2003, 15, No. 2, Jan. 16, pp. 143-146.

Hoffman, R.L., Norris, B.J., Wager, J.F. "ZnO-Based Transparent Thin-Film Transistors." Applied Physics Letters, vol. 82, No. 5, Feb. 3, 2003, pp. 733-735.

Zhang, D., Li, C., Han, S., Liu, X., Tang, T., Jin, W., Zhou, C. "Electronic Transport Studies of Single-Crystalline In203 Nanowires." Applied Physics Letters, V. 82, No. 1, Jan. 6, 2003, pp. 112-114.

Carcia, P.F., McLean, R.S., Reilly, M.H., Nunes Jr., G. "Transparent ZnO Thin-Film Transistor Fabricated by rf Magnetron Sputtering." Applied Physics Letters, V. 82, No. 7, Feb. 17, 2003, pp. 1117-1119.

Wang, D., Wang, Q., Javey, A., Tu, R., Dai, H., Kim, H., McIntyre, P.C., Krishnamohan, T., Saraswat, K.C. "Germanium Nanowire Field-Effect Transistors with SiO2 and High-κ HfO2 Gate Dielectrics." Applied Physics Letters, V. 83, No. 12, Sep. 22, 2003, pp. 2432-2434.

Liu, F., Bao, M., Wang, K.L., Li, C., Lei, B., Zhou, C. "One-Dimensional Transport of In2O3 Nanowires." Applied Physics Letters 86, 213101 (2005), pp. 213101-1 21310-3.

Hur, S.-H., Park, O.O., Rogers, J.A. "Extreme Bendability of Single-Walled Carbon Nanotube Networks Transferred from High-Temperature Growth Substrates to Plastic and Their Use in Thin-Film Transistors." Applied Physics Letters 86, 243502 (2005).

Takenobu, T., Takahashi, T., Kanbara, T., Tsukagoshi, K., Aoyagi, Y., Iwasa, Y. "High-Performance Transparent Flexible Transistors Using Carbon Nanotube Films." Applied Physics Letters 88, 033511 (2006).

Chang, P.-C., Fan, Z., Chien, C.-J., Stichtenoth, D., Ronning, C., Lu, J. G. "High-Performance ZnO Nanowire Field Effect Transistors." Applied Physics Letters 89, 133113 (2006).

Ju, S., Janes, D.B., Lu, G., Facchetti,A., Marks, T.J. "Effects of Bias Stress on ZnO Nanowire Field-Effect Transistors Fabricated with Organic Gate Nanodielectrics." Applied Physics Letters 89, 263102 (2006).

Cha, S.N., Jang, J.E., Choi,Y., Amaratunga, A.J., Ho, G.W., Welland, M.E., Hasko, D.G., Kang, D.-J., Kim, J.M. "High Performance ZnO Nanowire Field Effect Transistor Using Self-Assigned Nanogap Gate Electrodes." Applied Physics Letters 89, 263102 (2006).

Lang, O, Pettenkofer, C., Sanchez-Royo, J.F., Segura, A., Klein, A., Jaegermann, W. "Thin Film Growth and Band Lineup of In2O3 on the Layered Semiconductor InSe." J. of Applied Physics, V. 86, No. 10, Nov. 15, 1999, pp. 5687-5691.

Kim, S.Y., Lee, J.-L., Kim, K-B, Tak, Y.-H. "Effect of Ultraviolet-Ozone Treatment of Indium-Tin-Oxide on Electrical Properties of Organic Light Emitting Diodes." J. of Applied Physics, V. 96. No. 5, Mar. 1, 2004, pp. 2560-2563

Vashaee, D., Shakouri, A., Goldberger, J., Kuykendall, T., Pauzauskie, P., Yang, P. "Electrostatics of Nanowire Transistors with Triangular Cross Sections." J. of Applied Physics, 99, 054310 (2006).

Presley, R.E., Munsee, C.L., Park, C.-H., Hong, D; Wager, J.F., Keszler, D.A. "Tin Oxide Transparent Thin-Film Transistors." J. Physics D: Applied Physics, 37 (2004) 2810-2813.

Ju, Sanghyun, Lee, K., Janes, D.B.,Yoon, M-H., Facchetti, A., Marks. T.J. "Low Operating Voltage Single ZnO Nanowire Field-Effect Transistors Enabled by Self-Assembled Organic Gate Nanodielectrics." Nano Letters (2005) V. 5, No. 11, 2281-2286.

Banerjee, D., Lao, J.Y., Wang, D.Z., Huang, J.Y., Steeves, D., Kimball, B., Ren, Z.F. "Synthesis and Photoluminescence Studies on ZnO Nanowires." Nanotechnology, 15 (2004) 404-409.

Moon, T.-H., Jeong, M.-C., Oh, B.-Y., Ham, M.-H., Jeun, M.-H., Lee, W.-Y., Myoung, J.-M. "Chemical Surface Passivation of HfO2 Films in a ZnO Nanowire Transistor." Nanotechnology 17 (2006) 2116-2121.

Wang, L., Yoon, M.-H., Lu, G., Yang, Y., Facchetti, A., Marks, T.J. "High Performance Transparent Inorganic-Organic Hybrid Thin-Film N-Type Transistors." Nature Materials, V. 5, Nov. 2006, pp. 293-317.

Gassenbauer, Y., Schafranek, R., Klein, A., Zafeiratos, S., Hävecker, M., Knop-Gericke, A., Schlögl, R. "Surface States, Surface Potentials, and Segregation at Surfaces of Tin-Doped In2O3." Physical Review B. 73. 245312 (2006).

Yoon, M.-H., Facchetti, A., Marks, T.J. "σ-π Molecular Dielectric Multilayers for Low-Voltage Organic Thin-Film Transistors." PNAS, V. 102, No. 13, 4678-4682, Mar. 29, 2005.

Nomura, K., Ohta, H., Ueda, K., Kamiya, T., Hirano, M., Hosono, H. "Thin-Film Transistor Fabricated in Single-Crystalline Transparent Oxide Semiconductor." Science, 00368075, V. 300, Issue 5623, May 23, 2003.

Fortunato, E., Barquinha, P., Pimentel, A., Gonçalves, A., Marques, A., Pereira, L., Martins, R. "Recent Advances in ZnO Transparent Thin Film Transistors." Thin Solid Films 487 (2005) 205-211.

\* cited by examiner

TRANSPARENT NANOWIRE TRANSISTORS AND METHODS FOR FABRICATING SAME

This application claims priority benefit of application Ser. No. 60/932,636 filed Jun. 1, 2007, the entirety of which is incorporated herein by reference.

STATEMENT REGARDING FEDERALLY SPONSORED RESEARCH OR DEVELOPMENT

This invention, in part, was made with government support under Grant Nos. NCC-2-1363 and DMR0520513 awarded by the National Aeronautics and Space Administration Institute for Nanoelectronics and Computing and the National Science Foundation, respectively, to Northwestern University. The United States Government has certain rights in this invention

BACKGROUND

Development of optically transparent and mechanically flexible electronic circuitry represents an enabling step toward next-generation display technologies, including "see-through" and conformable products. In addition to transparency and flexibility, transistor performance metrics such as high on-current ($I_{on}$), high on/off current ratio ($I_{on}/I_{off}$), high field-effect mobility ($\mu_{eff}$), steep subthreshold slope (S), and small threshold voltage ($V_T$) variation during transistor operation are required to realize commercially viable logic circuits and display devices.

Nanowire transistors (NWTs), i.e., transistors incorporating semiconducting nanowires as charge transporting channel materials, are of particular interest for future display devices because of their high carrier mobilities and stability compared with other thin film transistors (TFTs). The use of pre-formed nanowires also allows low-temperature device processing, which is essential for applications such as circuits fabricated on plastic substrates. While there have been several recent reports of transparent transistors fabricated with ZnO, $SnO_2$, $In_2O_3$ or other semiconducting oxide thin films, or with carbon nanotube networks as the active channel layers and opaque source and drain metals, or with carbon nanotube films and transparent source/drain electrodes (see e.g., Carcia, P. F. et al., *Appl. Phys. Lett.*, 82: 1117-1119 (2003); Fortunato, E. et al., *Thin Solid Films*, 487: 205-211 (2005); Hoffman, R. L. et al., *Appl. Phys. Lett.*, 82: 733-735 (2003); Nomura, K. et al., *Science*, 300: 1269-1272 (2003); Presley, R. E. et al., *J. Phys. D: Appl. Phys.*, 37: 2810-2813 (2004); Wang, L. et al., *Nature Mater.*, 5: 893-900 (2006); Hur, S.-H. et al., *Appl. Phys. Lett.*, 86, 243502-1-3 (2005); and Takenobu, T. et al., *Appl. Phy. Lett.*, 88: 33511-1-3 (2006)), there have been no reports of fully transparent NWTs fabricated with all-transparent gate and source/drain electrodes and displaying high levels of transistor performance.

SUMMARY

In light of the foregoing, the present teachings provide nanowire-based transistors and circuits that can comprise one or more semiconducting nanowires as the channel material. In some non-limiting embodiments, the nanowire transistor structures of the present teachings can be fully transparent and comprise components made from various transparent materials. Given the small diameter of a nanowire, "fully transparent" nanowire transistors described herein can comprise one or more non-transparent nanowires (e.g., without limitation, nanowires made from Group 14 elements such as Si, Ge, and alloys thereof, one or more Group 13-15 elements such as GaAs, GaN, and InP, and one or more Group 12-16 elements such as CdS and CdSe) as well as transparent oxide nanowires (e.g., without limitation, ZnO, $In_2O_3$, and $SnO_2$ nanowires), and transparent gate and source/drain electrodes. The nanowire transistors of the present teachings can exhibit high performance n-type transistor characteristics with satisfactory optical transparency. Among various applications, the nanowire transistors of the present teachings can be attractive as pixel switching and driving transistors in active-matrix organic light-emitting diode (AMOLED) displays, and can supply sufficient current to drive pixels employing reported electroluminescent organic materials. The transparency of the drive circuitry can enable significant increases in aperture ratio in active-matrix arrays, which can lead to higher display brightness and decreased power consumption. The high mobility of the nanowire channel materials also can allow faster switching of the transistor circuits, which can allow circuit approaches such as direct digital drive of display elements.

In certain embodiments, the nanowire transistor devices of the present teachings can comprise one or more semiconducting nanowires extending between a source electrode and a drain electrode, and a gate dielectric in contact with the one or more semiconducting nanowires. In some embodiments, the device can include a single semiconducting nanowire as the channel material. In other embodiments, the device can include a plurality of semiconducting nanowires to fulfill larger current carrying needs. As described above, in some embodiments, the one or more semiconducting nanowires can be prepared from a Group 14 element such as, without limitation, Si and Ge. In other embodiments, transparent semiconducting nanowires prepared from transparent metal oxides such as, without limitation, ZnO, $In_2O_3$, and $SnO_2$, can be used.

In some embodiments, the gate dielectric can be an inorganic layer of one or more transparent metal oxides. For example, the gate dielectric can be a Group 3 metal oxide, a Group 5 metal oxide, or a Group 13 metal oxide such as, but not limited to, aluminum oxide ($Al_2O_3$), yttrium oxide ($Y_2O_3$), tantalum pentoxide ($Ta_2O_5$), hafnium oxide ($HfO_2$), and vanadium oxide ($V_2O_5$). Such metal oxides can optionally include one or more dopants. The oxide gate dielectric can be deposited by various techniques known in the art including, without limitation, thermal evaporation, sputtering, metalorganic chemical vapor deposition (MOCVD), atomic layer deposition (ALD), ion-assisted deposition (IAD), and pulsed-laser deposition (PLD).

In certain embodiments, the gate dielectric can be an organic multi-layer composition. This multi-layer composition can comprise periodically alternating layers of one or more layers that include a polarizable moiety, and one or more layers that can comprise a silyl or siloxane moiety. The polarizable moiety (e.g., without limitation, a π-polarizable moiety) can include conjugated π-electrons. The siloxane moiety can comprise oligomeric or polymeric moieties having —Si—O— bonds. In particular embodiments, there can be one or more layers that comprise a sigma moiety among the periodically alternating layers. The sigma moiety can comprise a hydrocarbon as described in more detail below.

In some embodiments, the polarizable moiety can be a moiety having at least one of a dipole moment, an electron releasing moiety, an electron withdrawing moiety, a combination of such moieties, a zwitterion and a net charge. For example, the polarizable moiety can be a non-linear optical (NLO) chromophore. In some embodiments, the chromophore can comprise a π-conjugated system, which can comprise a system of atoms covalently bonded with alternating single and multiple (e.g., double) bonds (e.g., C═C—C═C—C and C═C—N═N—C). The π-conjugated system can comprise one or more heteroatoms such as, but not limited to, nitrogen (N), oxygen (O), and sulfur (S). In some embodiments, the π-conjugated system can comprise one or more aromatic rings (aryl or heteroaryl) linked by conjugated hydrocarbon chains. In certain embodiments, the aromatic rings can be linked by conjugated chains that include heteroatoms and heteroatom-containing groups (e.g., azo groups [—N═N—]). For example, the polarizable moiety can be a chromophore that comprises a stilbazolium group.

Various polarizable moieties that can be used according to the present teachings are described in U.S. Pat. No. 6,855,274, in particular the NLO structures of FIGS. 1-2, 11, and 13-15 thereof, U.S. Pat. No. 6,549,685, in particular the NLO structures of FIGS. 2-3 thereof, and U.S. Pat. No. 5,156,918, in particular the NLO structures of FIGS. 4-5 thereof, each with reference to the corresponding specification regarding alternate embodiments, synthesis, and characterization, and each of which is incorporated by reference herein in its entirety. In particular embodiments, the polarizable moiety can comprise a stilbazonium group.

At least some of the alternating layers can be coupled to an adjacent layer by a coupling layer that comprises a siloxane matrix. The coupling can be performed via a condensation reaction or chemisorption using known silicon chemistry. For example, two layers including the polarizable moiety can be coupled to each other by a coupling layer that comprises a siloxane matrix, resulting in a three-layered composition that includes alternating layers of a first layer including a polarizable moiety, a coupling layer that includes a siloxane matrix, and a second layer that includes a polarizable moiety. One or more layers including a polarizable moiety also can be crosslinked by a siloxane matrix. In some embodiments, at least some of the alternating layers can be coupled or covalently bonded to one another or the siloxane matrix via a condensation reaction. For example, the three-layer composition described above can include condensation products of a silane-substituted stilbazolium compound (e.g., 4-[[(4-(N,N-bis((hydroxy)ethyl)amino]-phenyl]azo]-1-(4-trichlorosilyl)benzyl-pyridinium iodide, or 4-[[(4-(N,N-bis((hydroxy)ethyl)amino]-phenyl]azo]-1-(4-dichloroiodosilyl)benzyl-pyridinium iodide) and a trisiloxane compound (e.g., without limitation, octachlorotrisiloxane or other similar compounds including Si—O bonding sequence with hydrolyzable groups). Exemplary hydrolyzable groups comprise, without limitation, halides, hydroxyl groups, alkoxy groups, amine groups, and carboxyl groups.

In some embodiments, the multi-layer composition also can include a hydrocarbon layer (i.e., a sigma moiety). Such a hydrocarbon layer can comprise a $C_1$- about $C_{20}$ alkyl group or a $C_1$- about $C_{20}$ haloalkyl group. Such a hydrocarbon layer can be coupled to a coupling layer that comprises a siloxane matrix, or it can be coupled to a layer comprising a polarizable moiety directly or via a coupling layer that comprises a siloxane matrix as described above. To allow coupling, the alkyl or haloalkyl group can be functionalized with silyl moieties having hydrolyzable groups. For example, at least some of the alternating layers can include a condensation product of a bis(silyl)-about $C_4$ to about $C_{20}$ alkyl compound (e.g., without limitation, $Cl_3\,Si(CH2)_nSiCl_3$, $(CH_3O)_3Si(CH_2)_nSi(OCH_3)_3$, and $(Me_2N)_3\,Si(CH_2)_nSi(NMe_2)_3$, where n can be 4, 5, 6, 7, 8, 9, or 10) and a trisiloxane compound (e.g., without limitation, octachlorotrisiloxane or other similar compounds including Si—O bonding sequence with hydrolyzable groups). Such bis-silylated compounds are hydrolyzable to a degree at least partially sufficient for substrate sorption or condensation or intermolecular crosslinking via siloxane bond formation under the processing or fabrication conditions employed. Similarly, the polarizable moiety can be derivatized to include similar silyl hydrolyzable groups, to allow bond formation with the siloxane coupling layer and/or the hydrocarbon layer. In particular embodiments, the hydrocarbon layers and the layers comprising a polarizable moiety can be individually self-assembled monolayers. Synthesis of such self-assembled nanodielectric (SAND) materials are more fully described in Yoon, M-H. et al., PNAS, 102 (13): 4678-4682 (2005), which is incorporated by reference herein in its entirety.

In further embodiments, the gate dielectric can be a polymer. For example, the gate dielectric can be a polymer such as, without limitation, polyhydroxystyrene and polystyrene. In certain embodiments, the gate dielectric can be a crosslinked polymer, examples of which include, but are not limited to, the various crosslinked polymeric dielectric materials described in U.S. patent application Ser. Nos. 11/315,076, 60/816,952, and 60/861,308, each of which is incorporated by reference herein in its entirety.

The source electrode and the drain electrode can be prepared from various transparent conductive oxides. Examples include, without limitation, indium tin oxide (ITO), indium zinc oxide (IZO), indium oxide, zinc oxide, zinc indium tin oxide (ZITO), and other similar optionally doped metal oxides (e.g., fluorinated tin oxide, gallium zinc oxide (GZO), gallium indium oxide (GIO) and gallium indium tin oxide (GITO)). A nanowire transistor device of the present teachings also can, without limitation, comprise a gate electrode prepared from one or more of the transparent conductive oxides described above.

In various embodiments and to provide a fully transparent nanowire transistor device, the gate dielectric can be deposited on a transparent substrate. Examples of suitable substrates include but are not limited to glass and various transparent plastic materials (both rigid and flexible). Examples of flexible plastic substrates include, but are not limited to, polyethylene terephthalate (PET) and polyethylene naphthalate (PEN).

The present teachings further provide methods for fabricating a nanowire transistor device. Such a method can comprise applying a gate electrode layer on a substrate, applying a dielectric layer on the gate electrode layer, applying one or more semiconducting nanowires on the dielectric layer, and applying a source electrode and a drain electrode on the dielectric layer, wherein the application of the gate electrode layer, the application of the dielectric layer, the application of the one or more semiconducting nanowires, and the application of the source electrode and the drain electrode are conducted at a temperature less than about 100° C. (e.g., at or near room temperature). Each of the gate electrode layer, the dielectric layer, the source electrode, the drain electrode, and the substrate can be transparent (for example, by using the various suitable materials disclosed herein), and one or more semiconducting nanowires can extend between the source electrode and the drain electrode. In some embodiments, the application of the one or more semiconducting nanowires can involve dispersing a suspension that includes one or more semiconducting nanowires on the dielectric layer. In some embodiments, the application of the dielectric layer can comprise forming at least one condensation product of a silane-substituted stilbazoium compound and a trisiloxane compound, and optionally, at least one condensation product of a bis(silyl)-about $C_4$ to about $C_{20}$ alkyl compound and a trisiloxane compound. The resulting nanowire transistor device can be subjected to ozone treatment to further improve its device performance, for example, to increase its field effect mobility.

The foregoing, other features, and advantages of the present teachings, will be more fully understood from the following figures, description, and claims.

BRIEF DESCRIPTION OF DRAWINGS

It should be understood that the drawings described below are for illustration purpose only. The drawings are not necessarily to scale and are not intended to limit the scope of the present teachings in any way. The patent or application file contains at least one drawing executed in color. Copies of this patent or patent application publication with color drawing(s) will be provided by the office upon request and payment of the necessary fee.

FIG. 7a shows the $I_{ds}$-$V_{gs}$ characteristics at $V_d$=0.5 V of a representative $In_2O_3$ NWT having the structure illustrated in FIG. 6a. Green (1), red (2) and blue (3) data points corresponding to linear-scale $I_{ds}$-$V_{gs}$, log-scale $I_{ds}$-$V_{gs}$ and field effect mobility.

FIG. 7b shows the $I_{ds}$-$V_{ds}$ characteristics of a representative $In_2O_3$ NWT having the structure illustrated in FIG. 6a.

FIG. 8a shows the transconductance ($g_m$) at 5 $V_g$ of a representative $In_2O_3$ NWT having the structure illustrated in FIG. 6a.

FIG. 8b shows the channel conductance ($g_d$) from 0.0 $V_d$ to 1.8 $V_d$ of a representative $In_2O_3$ NWT having the structure illustrated in FIG. 6a.

FIG. 12a is a cross-sectional view of yet another embodiment of an NWT device structure according to the present teachings. In particular, this embodiment consists of a $SiO_2$ buffer layer, a patterned ITO gate electrode (120 nm), a SAND gate insulator (15 nm), and a single $SnO_2$ nanowire. Depending on the materials for the source/drain electrodes, the NWT can be partially (e.g., Al) or fully transparent (e.g., ITO).

FIG. 12b shows typical linear-scale and log-scale $I_{ds}$-$V_{gs}$ transfer characteristics at $V_d$=0.5 V of a representative $SnO_2$ NWT having the structure illustrated in FIG. 12a. Arrows indicate the appropriate axis.

FIG. 12c shows typical output plots for a representative $SnO_2$ NWT device having the structure illustrated in FIG. 12a.

FIG. 13a is a cross-sectional view of yet another embodiment of an NWT device structure according to the present teachings. In particular, this embodiment consists of a $SiO_2$ buffer layer, a patterned ITO gate electrode (120 nm), a SAND gate insulator (15 nm), and a single Ge nanowire. Depending on the materials for the source/drain electrodes, the NWT can be partially (e.g., Al) or fully transparent (e.g., ITO).

FIG. 13b shows typical output plots for a p-type Ge NWT device having the structure illustrated in FIG. 13a.

FIG. 13c shows typical log-scale $I_{ds}$-$V_{gs}$ transfer characteristics at $V_d$=−4 V of a p-type Ge NWT having the structure illustrated in FIG. 13a.

FIG. 13d shows typical output plots for an n-type Ge NWT device having the structure illustrated in FIG. 13a.

FIG. 13e shows typical log-scale $I_{ds}$-$V_{gs}$ transfer characteristics at $V_d$=−4 V of an n-type Ge NWT having the structure illustrated in FIG. 13a.

DETAILED SPECIFICATION

Figure 1:
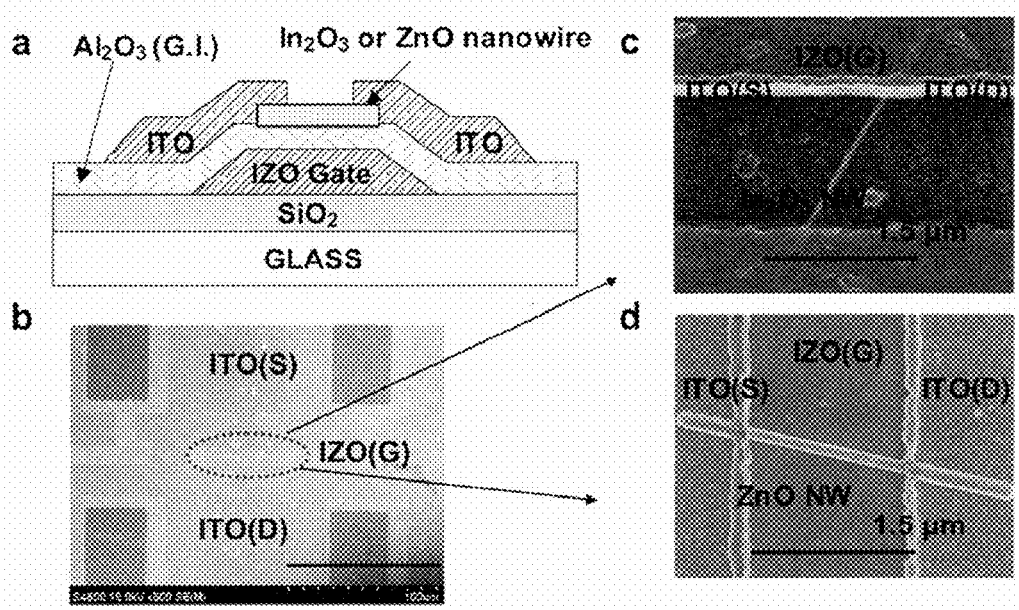
FIG. 1a is a cross-sectional view of an embodiment of a nanowire transistor (NWT) device according to the present teachings. In particular, the illustrated device consists of a $SiO_2$ buffer layer (500 nm), a patterned IZO (In—Zn—O) gate electrode (120 nm), an atomic layer deposition (ALD)-deposited $Al_2O_3$ gate insulator (18 nm), a single $In_2O_3$ nanowire (D~20 nm) or ZnO nanowire (D~120 nm) for the active channel, and ITO for the source/drain electrodes (120 nm). Scale bar: 100 µm.
FIG. 1b is a top-view field-emission scanning electron microscopic (FE-SEM) image of an NWT device analogous to the one illustrated in FIG. 1a. Scale bar: 100 µm.
FIG. 1c is a top-view SEM image of a single $In_2O_3$ nanowire region (D/L~20 nm/1.80 µm) of an NWT device analogous to the one illustrated in FIG. 1a. Scale bar: 1.5 µm.
FIG. 1d is a top-view SEM image of a single ZnO nanowire region (D/L~120 nm/1.66 µm) of an NWT device analogous to the one illustrated in FIG. 1a. Scale bar: 1.5 µm.

Throughout the description, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited processing steps.

In the application, where an element or component is said to be included in and/or selected from a list of recited elements or components, it should be understood that the element or component can be any one of the recited elements or components and can be selected from a group consisting of two or more of the recited elements or components. The use of the term "include" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise.

It should be understood that the order of steps or order for performing certain actions is immaterial so long as the present teachings remain operable. Moreover, two or more steps or actions may be conducted simultaneously.

As used herein, "halide" or "halogen" refers to F, Cl, Br, and I.

As used herein, "amino" refers to —$NH_2$, an —NH-alkyl group, and an —N(alkyl)$_2$ group.

As used herein, "alkoxy" refers to an —O-alkyl group. Examples of alkoxy groups include, but are not limited to, methoxy, ethoxy, propoxy (e.g., n-propoxy and isopropoxy), t-butoxy groups, and the like.

As used herein, "alkyl" refers to a straight-chain or branched saturated hydrocarbon group. Examples of alkyl groups include methyl (Me), ethyl (Et), propyl (e.g., n-propyl and isopropyl), butyl (e.g., n-butyl, isobutyl, sec-butyl, tert-butyl), pentyl groups (e.g., n-pentyl, isopentyl, neopentyl), and the like. In various embodiments, an alkyl group can have 1 to 20 carbon atoms, i.e., a $C_{1-20}$ alkyl group. In some embodiments, an alkyl group can have 1 to 6 carbon atoms, and can be referred to as a "lower alkyl group." Examples of lower alkyl groups include methyl, ethyl, propyl (e.g., n-propyl and isopropyl), and butyl groups (e.g., n-butyl, isobutyl, sec-butyl, tert-butyl).

As used herein, "haloalkyl" refers to an alkyl group having one or more halogen substituents. Examples of haloalkyl groups include, but are not limited to, $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups wherein all of the hydrogen atoms are replaced with halogen atoms (e.g., $CF_3$ and $C_2F_5$), are included within the definition of "haloalkyl." For example, a $C_{1-20}$ haloalkyl group can have the formula —$C_iX_{2j}$— or —$C_iH_{2i-j}X_j$—, wherein X is F, Cl, Br, or I, i is an integer in the range of 1 to 20, and j is an integer in the range of 0 to 40, provided that i is less than or equal to 2j.

FIG. 1a shows a cross-sectional view of an NWT structure with an individually addressed bottom gate. As one embodiment of the present teachings, the structure of FIG. 1a includes a $SiO_2$ buffer layer, a patterned IZO gate electrode, an atomic layer deposition (ALD)-derived high-κ $Al_2O_3$ gate insulator, a single-crystal semiconducting $In_2O_3$ or ZnO nanowire for the active channel, and ITO for the source/drain electrodes. In the embodiment shown, no further passivation layers are used so that the dielectric above the nanowire is air. $In_2O_3$ nanowires and ZnO nanowires can be prepared according to procedures described in Li, C. et al., *Adv. Mater.*, 15: 143-145 (2003) and Banerjee, D. et al., *Nanotechnology*, 15: 404-409 (2004), both of which are incorporated by reference herein in their entireties.

FIG. 1b shows a top view field-emission scanning electron microscopic (FE-SEM) image of an NWT device analogous to the one illustrated in FIG. 1a. As shown, the IZO gate overlaps with the ITO source/drain electrodes. By fully covering the nanowire channel, transistor performance can be improved. FE-SEM images of single $In_2O_3$ and ZnO nanowires between source and drain electrodes are shown in FIGS. 1c and 1d, respectively. For the particular embodiments shown, the corresponding nanowire diameters (D) and lengths (L) of single $In_2O_3$ or ZnO nanowires addressed between source and drain on the glass substrates are 20 nm/1.80 μm and 120 nm/1.66 μm, respectively.

Figure 2:
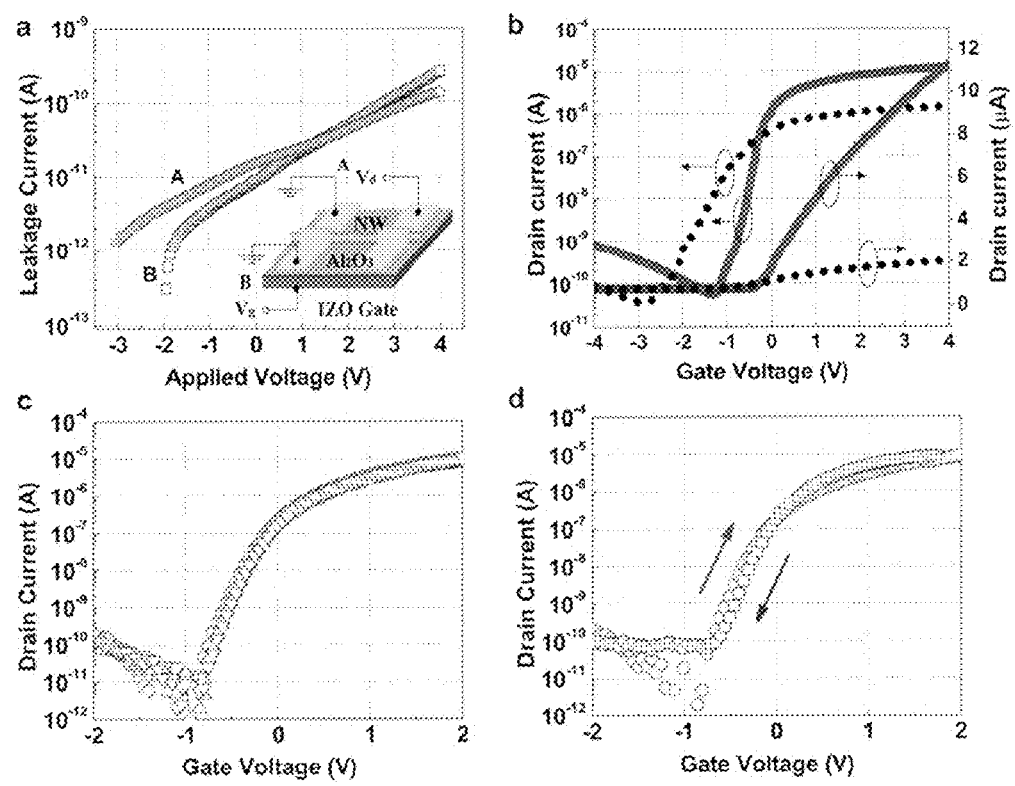
FIG. 2a shows the gate leakage current (B: black dots) and the drain leakage current (A: red dots) of a representative $In_2O_3$ NWT device according to the present teachings. The inset shows the bias configurations.
FIG. 2b shows the linear-scale and log-scale $I_{ds}$-$V_{gs}$ characteristics at $V_d$=0.5 V of a representative $In_2O_3$ NWT device analogous to the one illustrated in FIG. 1a. Arrows indicate appropriate axis. Data points are shown for the device before (black dots, 1) and after (red solid line, 2) two minutes of ozone treatment.
FIG. 2c shows the log-scale $I_{ds}$-$V_{gs}$ characteristics during four successive sweeps from −4 V to +4 V ($V_d$=0.5 V) of a representative $In_2O_3$ NWT device analogous to the one illustrated in FIG. 1a. Black, red, green and blue (square, circular, up and down triangle) data points correspond to $1^{st}$, $2^{nd}$, $3^{rd}$ and $4^{th}$ sweeps. The time between sweeps is ~1 second.
FIG. 2d shows the measured $I_{ds}$-$V_{gs}$ characteristics of a representative $In_2O_3$ NWT device analogous to the one illustrated in FIG. 1a, showing sweeps from −2 $V_g$ to +2 $V_g$ (red circles) and from +2 $V_g$ to −2 $V_g$ (blue squares) as indicated by arrows ($V_d$=0.5 V). The bias sweep rate ($dV_g/d_t$) is 2 V/sec.

FIG. 2a shows the gate and drain leakage currents of a representative $In_2O_3$ NWT device for the bias configurations shown in the inset. The drain leakage current here is the summation of the body current leakage of the $In_2O_3$ nanowire (~40 pA at 2 V) and the leakage current through the gate dielectric (~1 pA at 2 V). The $Al_2O_3$ gate dielectric exhibits good insulating properties with an electrical breakdown field larger than about 8 MV/cm (see Lin, H. C., et al., *Appl. Phys. Lett.*, 87: 182904-1-3 (2005)), and a dielectric constant of ~9. The thin $Al_2O_3$ gate dielectric allows the channel potential to be modulated at a relatively low gate voltage without significant gate leakage, resulting in a steep S and a high $I_{on}/I_{off}$.

FIG. 2b shows the linear-scale and log-scale drain current versus gate-source voltage ($I_{ds}$-$V_{gs}$) characteristics at $V_d$=0.5 V for a representative $In_2O_3$ NWT device analogous to the one illustrated in FIG. 1a before (black dots) and after (red solid line) two minutes of ozone treatment. As shown, ozone treatments for two minutes resulted in significant device performance enhancements in terms of S, $V_T$ and $I_{on}$. Compared to as-fabricated devices, the S value was reduced from 600 mV/dec to 160 mV/dec along with improvement in the $I_{on}/I_{off}$ (~$10^6$), and a shift in $V_T$ from −1.16 V to −0.27 V. Without wishing to be bound by any particular theory, the improvement in the S value can be due to the change in terms of a reduction in the interfacial trap states and in fixed surface charge states. See e.g., Ju, S. et al., *Appl. Phys. Lett.*, 89: 193506-1-3 (2006). Ozone treatment not only can remove defects and contamination from the nanowire surface, but can also change the work function. See e.g., Lang, O. et al., *J. Appl. Phys.*, 86: 5687-5691 (1999) and Gassenbauer, Y. et al., *Phys. Review B*, 73: 245312-1-11 (2006). Ozone is also expected to increase the density of oxygen vacancies near the nanowire surface. Because oxygen vacancies can act as donor states, ozone treatment can increase the conductivity of the nanowire. Although the ITO and IZO microstructures and chemical bonding states are somewhat more complex, the basic crystal structures are sufficiently similar to those of $In_2O_3$ and ZnO to reasonably expect that the $In_2O_3$ and ZnO nanowire work functions will increase similarly upon ozone treatment. Thus, the source/drain—nanowire contact should not significantly change on ozone treatment. However, and again without wishing to be bound by any particular theory, because the ozone treatment can plausibly reduce nanowire surface dangling bonds and carbon contamination and can form an oxygen vacancy-rich surface, transistor characteristics including $I_{on}/I_{off}$, S, and $V_T$ are expected to be enhanced. See Kim, S. Y. et al., *J. Appl. Phys.*, 95: 2560-2563 (2004).

FIG. 2c shows the log-scale drain current versus gate-source voltage ($I_{ds}$-$V_{gs}$) characteristics of a representative $In_2O_3$ NWT device analogous to the one illustrated in FIG. 1a during four successive sweeps from −2 V to +2 V, illustrating the stability of the $In_2O_3$ NWTs of the present teachings. The $I_{ds}$-$V_{gs}$ curves are comparable following bias sweeps, with consistent $I_{on}/I_{off}$, S, and $V_T$ values. Furthermore, for the same device, $I_{ds}$-$V_{gs}$ curves were swept from negative gate voltage ($V_g$(−)) to positive gate voltage ($V_g$(+)) and back to $V_g$(−) as shown in FIG. 2d. Over this bias range, the hysteresis is modest, which illustrates the high quality of the $Al_2O_3$ gate insulator and indicates negligible charge trapping and detrapping in the gate insulator.

Figure 3:
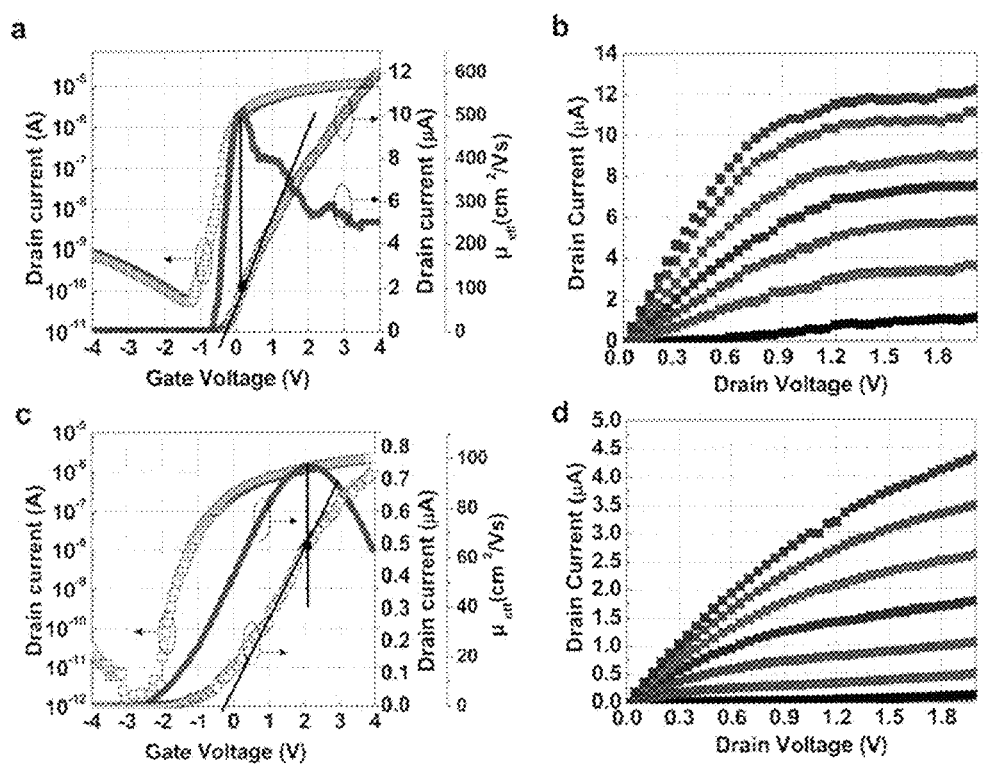
FIG. 3a shows the $I_{ds}$-$V_{gs}$ characteristics at $V_d$=0.5 V of a representative $In_2O_3$ NWT device (D/L~20 nm/1.80 µm) analogous to the one illustrated in FIG. 1a. Blue (1), red (2), and green (3) data points correspond to linear-scale $I_{ds}$-$V_{gs}$, log-scale $I_{ds}$-$V_{gs}$ and $\mu_{eff}$. Arrows indicate appropriate axis.
FIG. 3b shows the Ids-Vds characteristics of a representative In2O3 NWT device analogous to the one illustrated in FIG. 1a. Vg is from −0.5 V to 2.5 V at 0.5 V steps, with the maximum current observed at Vg=2.5 V.
FIG. 3c shows the Ids-Vgs characteristics at Vd=0.5 V of a representative ZnO NWT device (D/L~120 nm/1.66 µm) analogous to the one illustrated in FIG. 1a. Blue (1), red (2), and green (3) data points correspond to linear-scale $I_{ds}$-$V_{gs}$, log-scale $I_{ds}$-$V_{gs}$ and $\mu_{eff}$. Arrows indicate appropriate axis.
FIG. 3d shows the $I_{ds}$-$V_{ds}$ characteristics of a representative ZnO NWT device analogous to the one illustrated in FIG. 1a. $V_g$ is from 0.0 V to 3.0 V at 0.5 V steps, with the maximum current observed at $V_g$=3.0 V.

FIGS. 3a and 3c show the drain current versus gate-source voltage ($I_{ds}$-$V_{gs}$) characteristics for representative single $In_2O_3$ and ZnO NWTs. The $In_2O_3$ device (same device as in FIGS. 2a and 2b) exhibited S=160 mV/dec, $I_{on}/I_{off}$=$10^6$, and $V_T$=−0.27 V. The $\mu_{eff}$ of the representative $In_2O_3$ NWT, deduced from transconductance ($g_m$=$dI_d/dV_g$) varied from ~514 to 300 cm²/V-sec as the gate bias was increased from 0 V to 2 V, following a trend that is observed in NWTs, TFTs and MOSFETs. The ZnO NWT device exhibited S=0.3 V/dec, $I_{on}/I_{off}$~$10^6$, $V_T$=−0.07 V, and $\mu_{eff}$ varied from ~96 to 70 cm²/V-sec over the gate bias range of 0 V to 3 V. One important device performance metric for high-speed and low-power operation is the S=$dV_{gs}$/dlog $I_{ds}$ (mV/dec). A small S value is required for switching transistors, ideally approaching the theoretical limit of about 60 mV/dec. The present S values were extracted from the linear portion of the log $I_{ds}$ versus $V_{gs}$ plot (FIGS. 3a and 3c). The very small S values in the $In_2O_3$ and ZnO devices of the present teachings are comparable with those of previously reported non-transparent $In_2O_3$ and ZnO NWT devices. See Liu, F. et al., *Appl. Phys. Lett.*, 86: 213101-1-3 (2005) and Chang, P.-C. et al., *Appl. Phys. Lett.*, 89: 133113 (2006).

FIGS. 3b and 3d show the drain current versus drain-source voltage ($I_{ds}$-$V_{ds}$) characteristics of representative fully transparent single $In_2O_3$ and ZnO NWTs according to the present teachings. These devices exhibited typical enhancement mode long-channel FET behavior. For the fully transparent $In_2O_3$ single NWT device, $I_{on}$ is about 1×$10^{-5}$ μA at $V_{ds}$=1.0 V and $V_{gs}$=2.0 V. The $I_{on}$ of a ZnO single NWT device was about 2 μA at $V_{ds}$=1.0 V and $V_{gs}$=2.0 V. The performance of these $In_2O_3$ and ZnO NWT devices is comparable with that of previously reported non-transparent $In_2O_3$ and ZnO NWT devices. See e.g., Liu, F. et al., *Appl. Phys. Lett.*, 86: 213101-1-3 (2005); Chang, P.-C. et al., *Appl. Phys. Lett.*, 89: 133113 (2006); Zhang, D. et al., *Appl. Phy. Lett.*, 82: 112-114 (2003); Cha, S. N. et al., *Appl. Phy. Lett.*, 89: 263102-1-3 (2006); Moon, T.-H. et al., *Nanotechnology*, 17: 2113-2121 (2006); Ju, S. et al., *Nano. Lett.*, 5: 2281-2286 (2005). Because the extraction procedure for $\mu_{eff}$ involves uncertainties due to the required capacitance estimation (see Example 4 infra), NWTs can be compared to planar transistors by comparing the $I_{on}$ and $g_m$ per unit width ($g_m$/W), using the nanowire diameter as the device width. The $In_2O_3$ nanowire on glass exhibited an $I_{on}$ density of about 600 mA/mm and a $g_m$/W of ~212 mS/mm. Both values are more than 5 times higher than those obtained in prior studies on transparent transistors using $In_2O_3$ thin films, even after adjusting for the differences in gate lengths and gate capacitance. Without wishing to be bound by any particular theory, the single-crystal nature of the nanowires, along with the formation of relatively high quality interfaces, are believed to play key roles.

Figure 4:
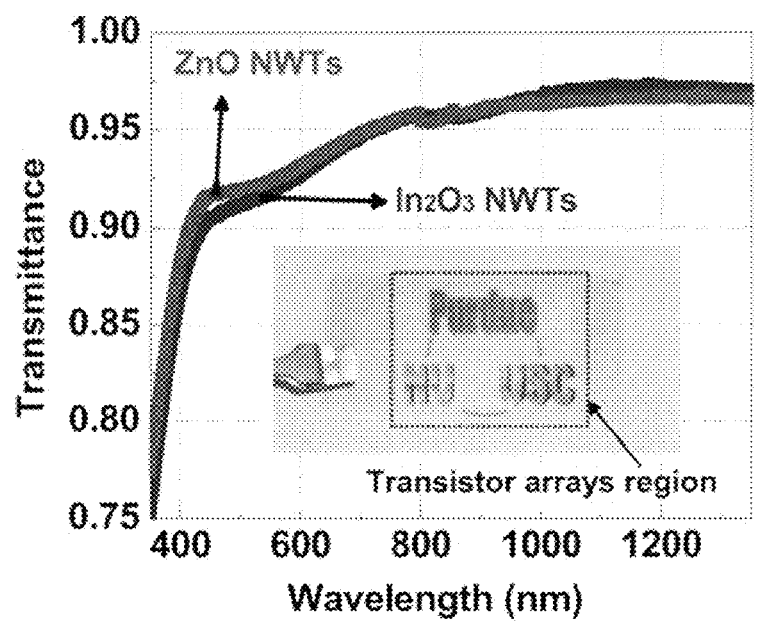
FIG. 4 shows the optical transmission spectra for regions containing an $In_2O_3$ NWT or a ZnO NWT according to the present teachings on a glass substrate (ITO (source/drain)/$In_2O_3$ or ZnO nanowires/$Al_2O_3$ (dielectric)/IZO (gate)/$SiO_2$/glass). Blue and red lines correspond to $In_2O_3$ and ZnO NWTs, respectively. The inset shows a photographic image of a glass substrate having 23,000 $In_2O_3$ NWT devices deposited on its surface, with text on an underlying opaque layer clearly visible.

FIG. 4 shows the optical transmission spectra through the $In_2O_3$ and ZnO NWT structures, with the substrate absorption removed. As shown in FIG. 4, an average transmittance of greater than about 90% were observed in the visible and near-infrared spectrum for both transistor types. With the substrate included, optical transmissions of about 82% ($In_2O_3$ NWT+glass substrate) and about 83% (ZnO NWT+ glass substrate) in the 350 nm-1350 nm wavelength range were observed. The NWT array regions measured 1.0"×0.5" (the glass substrate measured 1.5"×1.0"), and contained 23,000 NWT device patterns. In the embodiments studied, the substrates were entirely covered by the $SiO_2$ buffer layer and the $Al_2O_3$ gate insulator. The source/drain regions and the gate regions covered about 45% and about 25% of the total NWT array region, respectively. Due to their small diameter, the optical absorption of the $In_2O_3$ and ZnO nanowires should thus be negligible, and the area covered by the nanowires was relatively small compared to the entire NWT array. The observation of a greater than about 90% optical transmission indicates that the transmission losses due to the various layers, including the nanowires, were negligible, and that visible light could readily penetrate the dense NWTs. The inset in FIG. 4 shows a transparent $In_2O_3$ NWT device structure, with text on an underlying opaque layer clearly visible.

Figure 5:
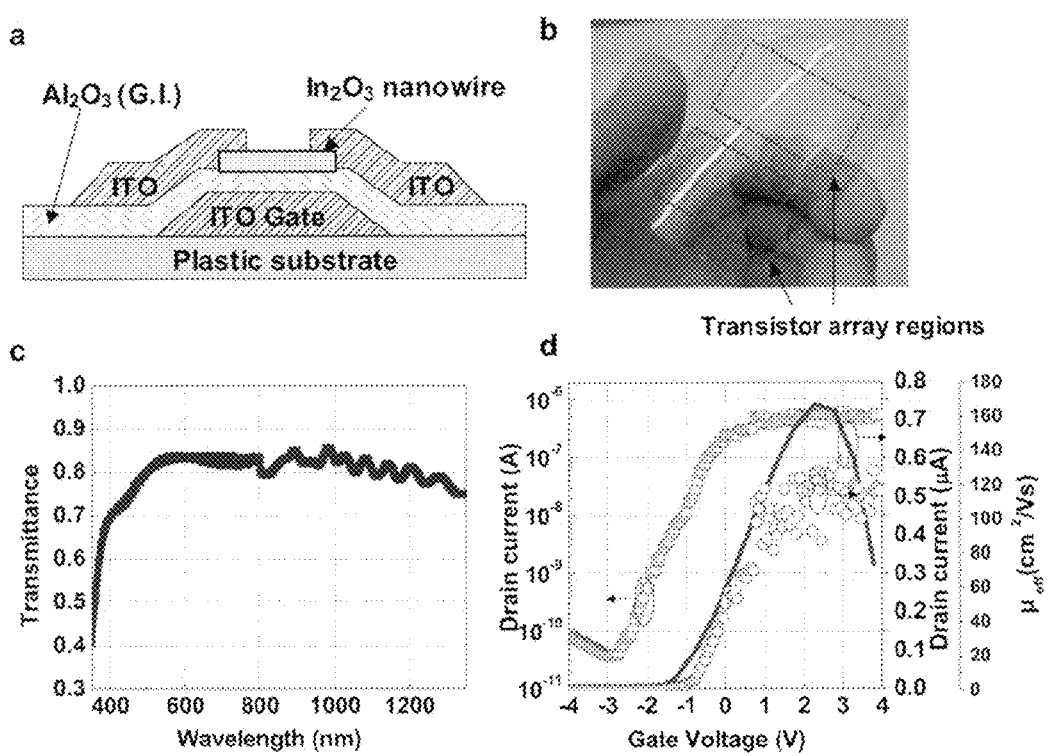
FIG. 5a is a cross-sectional view of a fully transparent and flexible NWT device according to the present teachings. In particular, the illustrated device consists of a plastic substrate, a patterned ITO gate electrode (120 nm), an ALD-deposited $Al_2O_3$ gate insulator (50 nm), a single $In_2O_3$ nanowire (D/L~20 nm/1.79 µm) for the active channel, and ITO for the source/drain electrodes (120 nm).
FIG. 5b is a photographic image of arrays of representative $In_2O_3$ NWTs deposited on a plastic substrate, showing the optical clarity and mechanical flexibility of the NWTs.
FIG. 5c shows the optical transmission spectrum of one of the transistor array regions containing $In_2O_3$ NWTs on the plastic substrate (ITO(S/D)/$In_2O_3$ NWs/$Al_2O_3$/ITO(G)/plastic substrate) shown in FIG. 5b.
FIG. 5d shows the $I_{ds}$-$V_{gs}$ characteristics at $V_d$=0.5 V of a representative $In_2O_3$ NWT having the structure as illustrated in FIG. 5a. Blue (1), red (2), and green (3) data points correspond to linear-scale $I_{ds}$-$V_{gs}$, log-scale $I_{ds}$-$V_{gs}$ and $\mu_{eff}$. Arrows indicate appropriate axis.

In some embodiments, NWT devices according to the present teachings can include a flexible plastic substrate. For example, fully transparent and flexible $In_2O_3$ NWT devices using a polyethylene terephthalate (PET) plastic substrate (e.g., Melinex, DuPont) were fabricated and characterized. A cross-sectional view of a representative fully transparent and flexible $In_2O_3$ NWT device structure with an individually addressed bottom gate is shown in FIG. 5a. Specific embodiments of such devices can include a single $In_2O_3$ nanowire addressed between the source and drain contacts having D and L of 20 nm and 1.79 μm, respectively. The gate and source/drain electrodes can be made from ITO. To suppress the leakage current due to tensile/compressive stress of the plastic substrate during photolithographic processing (up to 130° C.) and gate insulator deposition (up to 200° C.), a relatively thick $Al_2O_3$ gate insulator (50 nm) can be used. FIG. 5b is a photographic image of a plastic substrate (PET) containing arrays of $In_2O_3$ NWTs according to these embodiments, showing their optical clarity and mechanical flexibility.

FIG. 5c shows the optical transmission spectrum of one of the transistor array regions containing $In_2O_3$ NWTs on the plastic substrate (ITO(S/D)/$In_2O_3$ NWs/$Al_2O_3$/ITO(G)/plastic substrate) shown in FIG. 5b. The optical transmission through the NWT structure and substrate was measured to be about 81% in the 350 nm-1350 nm wavelength range. FIG. 5d shows the $I_{ds}$-$V_{gs}$ characteristic of a representative single $In_2O_3$ NWT on the plastic substrate. The S value was determined to be about 0.9 V/dec, $I_{on}/I_{off}$ was in the order of $10^5$, $V_T$=−0.6 V, and $\mu_{eff}$ varied from ~167 to 120 cm²/V-sec over the gate bias range of 1 V to 3.5 V. The lower but respectable response characteristics on the plastic substrate could reflect the effects of high temperature deposition (300° C.) and post rapid thermal annealing (RTP, 500° C. for 30 s in $N_2$).

As an alternative to using inorganic oxides as the gate dielectric, NWTs of the present teachings can include a gate dielectric made from an organic multi-layered composition. This multi-layered composition can include periodically alternating layers of one or more layers that include a polarizable moiety, and one or more layers that include a silyl or siloxane moiety. In particular embodiments, these layers can be individually self-assembled monolayers. Synthesis of such self-assembled nanodielectric (SAND) materials are more fully described in Yoon, M-H. et al., *PNAS*, 102 (13): 4678-4682 (2005), which is incorporated by reference herein in its entirety.

Figure 6:
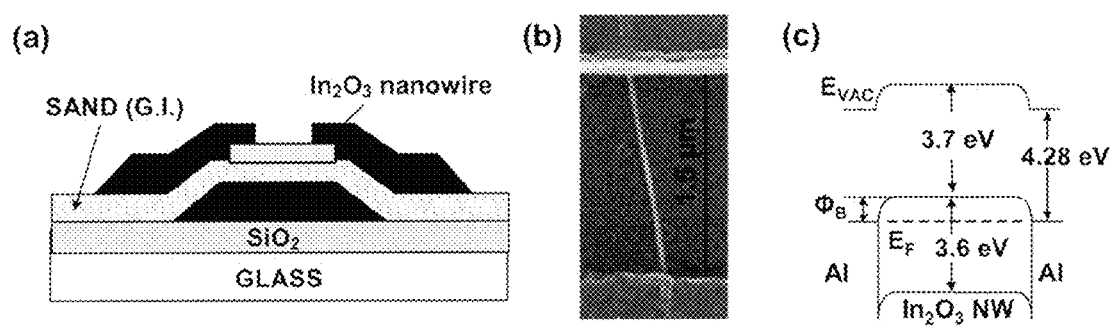
FIG. 6a is a cross-sectional view of another embodiment of an NWT device according to the present teachings, specifically, one incorporating self-assembled nanodielectrics (SAND) as the gate insulator.
FIG. 6b is a top-view FE-SEM image of a representative device having the structure illustrated in FIG. 6a. Scale bar: 1.5 µm.
FIG. 6c is a cross-sectional band diagram of a representative device having the structure illustrated in FIG. 6a at $V_{gs}$=0V.
Figure 7:
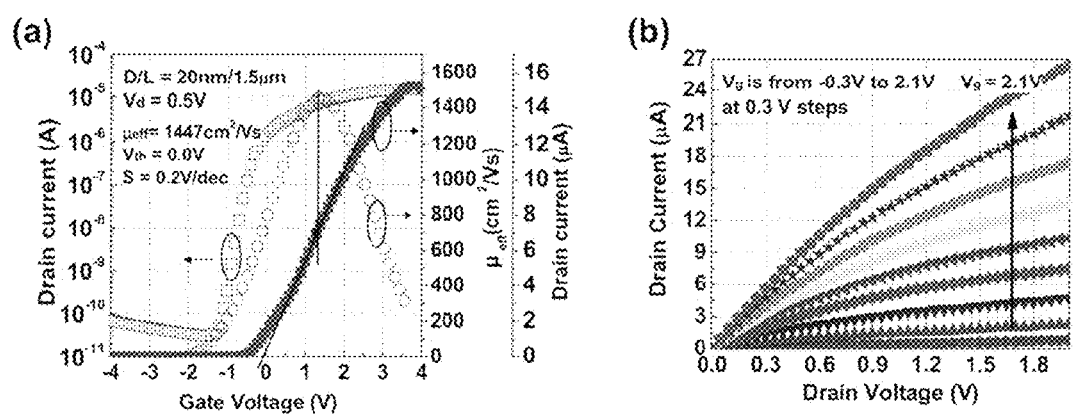
Figure 8:
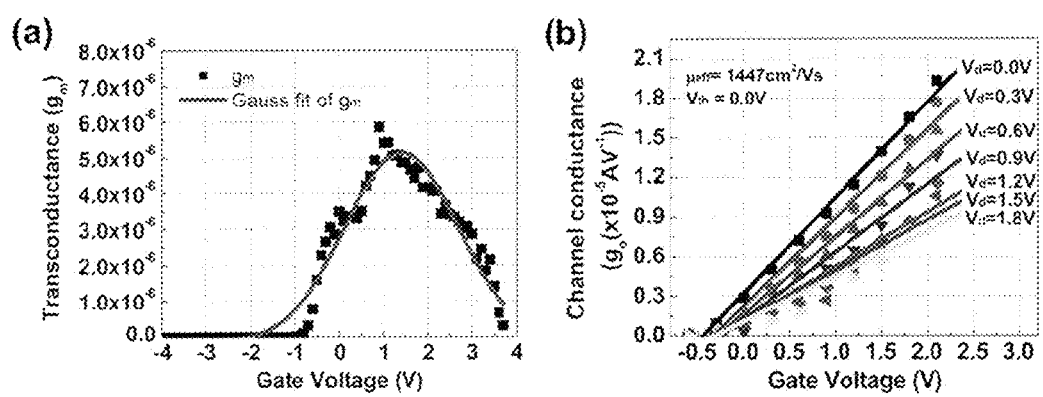

In a preliminary study, nanowire transistors using individual $In_2O_3$ nanowires as the channel material and a ~15 nm thick SAND as the dielectric (capacitance ~180 nF/cm² and leakage current density ~1×10⁻⁶ A/cm² up to 2.0 V) were investigated. The NWTs studied used an individually addressable indium zinc oxide (IZO) bottom-gate and Al source/ drain electrodes (FIG. 6), which rendered the channel region completely transparent. The diameter and length of the $In_2O_3$ nanowires were 20 nm and 1.6 μm, respectively. The device characteristics (FIG. 7) following ozone treatment to improve and optimize the device performance exhibited n-type transistor characteristics with a subthreshold slope (S) of 0.2 V/dec, a current on-off ratio ($I_{on}/I_{off}$) of $10^6$, a threshold voltage ($V_T$) of 0.0 V, and transconductance ($g_m$) and channel conductance ($g_d$) as illustrated in FIG. 8. The $g_m$ at $V_d$=0.5 V peaked at ~5.87 μS, and the $g_d$ was proportional with the gate voltage. The drain current versus drain-source voltage ($I_{ds}$-$V_{ds}$) characteristics of a representative SAND-based $In_2O_3$ NWT are shown in FIG. 7b. The device exhibited high $I_{on}$~12 μA for the single $In_2O_3$ nanowire at $V_{ds}$=1 V, $V_{gs}$=1.5 V, respectively. This current level would be sufficient to drive a 71×213 μm pixel at 300 cd/m² in current-generation electroluminescent technologies. The field-effect mobility ($\mu_{eff}$) which was extracted from the $g_m$ and $g_d$ of the NWTs, along with an estimated gate-to-channel capacitance, is also plotted versus gate bias in FIG. 7a. The value of $\mu_{eff}$ varied from ~1447 cm²/V-sec to ~300 cm²/V-sec over the reported gate bias range. The peak value was much higher than recently reported results for $In_2O_3$ nanowires (electron mobility of 279 cm²/V-sec and 98.1 cm²/V-sec, effective mobility 6.93 cm²/ V-sec) and ideal single-crystal $In_2O_3$ bulk mobility (~160 cm²/V-sec). Without wishing to be bound by any particular theory, it is believed that the single crystal nature of the nanowires, along with the quasi-one-dimensional nature of nanowires which inhibits low-angle scattering, could contribute to the relatively high $\mu_{eff}$. As shown, the SAND dielectric also appeared suitable for realizing relatively high performance in oxide nanowires. The device performance of SAND-based NWTs according to the present teachings is better than other $In_2O_3$ nanowire transistors and comparable with poly-Si TFTs and α-Si TFTs, in terms of S and $\mu_{eff}$. Because it is desirable to obtain high $\mu_{eff}$ and a steep S to fabricate fast switching transistors and high-speed logic electronic devices, these results indicate that SAND-based $In_2O_3$ NWTs can support the requirements of these devices.

Possible applications of the present transparent NWTs include pixel drivers for active matrix displays such as active matrix liquid crystal displays (AMLCDs), active matrix light-emitting diodes (AMLEDs), and active matrix organic light-emitting diodes (AMOLEDs). For example, for AMOLEDs, increasing the aperture ratio is necessary to increase efficiency and reduce power consumption. For non-transparent transistors, maximizing the aperture ratio corresponds to minimizing the transistor and capacitor physical sizes. Transparent transistors would allow stacking of the drive transistors with the OLEDs, which would allow a larger transistor size (width/length) and capacitor size (single or dual capacitors). Device geometries could then be optimized to improve metrics such as peak luminescence, Commission Internationale de L'Eclairage Coordinates (CIE), and power consumption. Importantly, the present NWTs can exhibit relatively high performance in comparison to typical TFTs for display applications, which should allow higher operating speeds and/or smaller device areas. For instance, in order to produce white peak luminance of ~300 cd/m² (71×213 µm pixel size, 40% aperture ratio, 40% polarizer transmission, 5.1 cd/A of red, 13 cd/A of green, 5.7 cd/A of blue, and (0.31, 0.32) of white CIE) using phosphorescent materials, driving transistors on RGB pixels must provide ~2.44 µA (red), ~1.01 µA (green), ~1.46 µA (blue) and ~3.9 µA (white), respectively. The present transparent NWTs were found to be suitable for switching and driving transistors on such pixels. It is also expected that the required current for AMOLED operation will decrease with the increasing aperture ratio provided by all-transparent components. The realization of flexible and transparent NWTs such as those according to the present teachings therefore could also enable high resolution and low-power consumption products such as heads-up displays.

Accordingly, the present teachings also provide fully transparent transistor display circuit elements (e.g., usable to drive a AM display), in which the switching and driving circuits are comprised of transistors using $In_2O_3$ nanowires as active channel materials. In some embodiments, these transistors can include a multilayer self-assembled gate dielectric (SAND) as a gate insulator and indium tin oxide (ITO) as transparent conductive gate and S-D electrodes. For these devices, a coplanar transistor structure consisting of ITO S-D electrodes/$In_2O_3$ NW/SAND/bottom ITO gate electrodes can be used. A robust gate insulator typically is required to maintain high breakdown voltage and low density of defect states. Use of the SAND dielectric (thickness ~24 nm) can ensure high $\mu_{eff}$, a steep S, low operating voltage and a high on-off current ratio ($I_{on}/I_{off}$).

Figure 9:
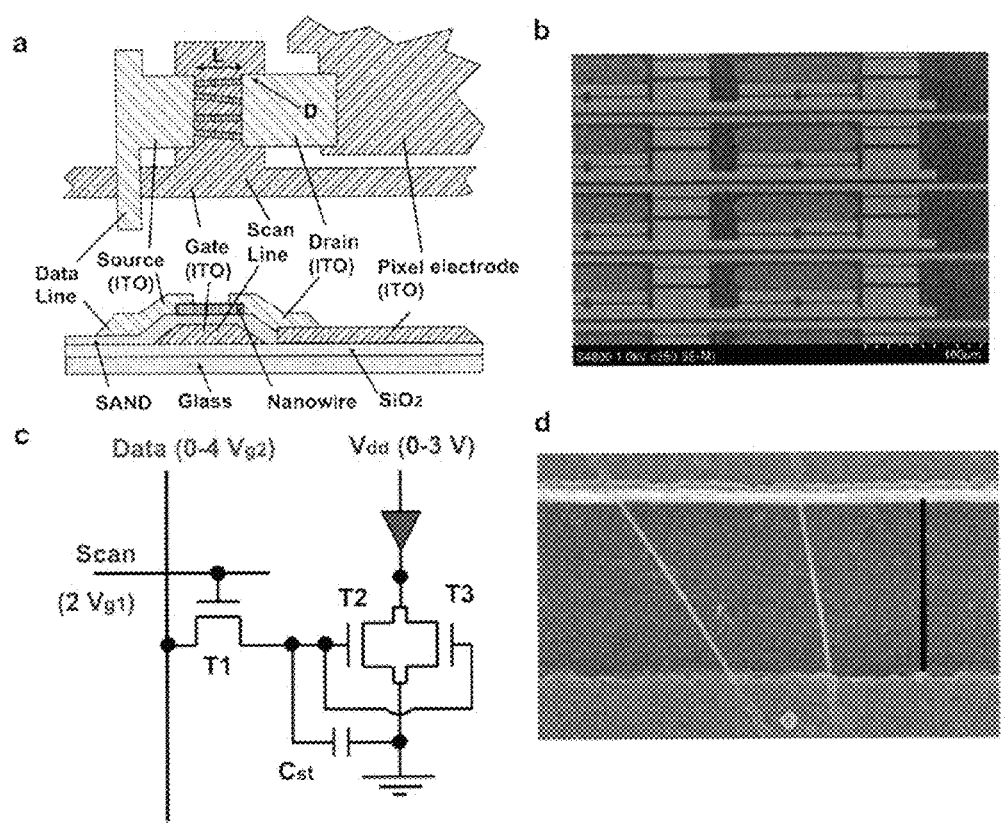
FIG. 9a shows the top and cross-sectional pixel structure of a drive transistor in a NW-AMOLED array. In particular, each NWT in the circuit structures consists of a $SiO_2$ buffer layer (200 nm), a patterned ITO gate electrode (100 nm), a SAND gate dielectric (24 nm), multiple $In_2O_3$ nanowires for the active channel, ITO for the S-D electrodes (100 nm), and a $SiO_2$ passivation layer (200 nm). The ITO pad on the right serves as the cathode for the organic light-emitting diode (OLED).
FIG. 9b is a top-view FE-SEM image of several 54×176 μm pixels within a 2×2 mm NWT array layout (rectangles with rounded ends), along with control transistors.
FIG. 9c is a schematic for a circuit as shown in FIG. 9a for a single pixel, consisting of 1 switching transistor (T1), 2 driving transistors (T2 and T3) and 1 storage capacitor. The bias condition to operate transistor circuit (2 V on scan line for fully turn-on, varying 0 V to 4 V on data line, and 5 V on $V_{dd}$ line).
FIG. 9d is an FE-SEM image of a representative region within an NWT transistor channel, showing multiple $In_2O_3$ nanowires connected between S-D electrodes. The diameter of a nanowire and the channel length between S-D electrodes of the device are ~50 nm and ~1.5 μm, respectively. Scale bar: 1.5 μm.

FIG. 9 shows FE-SEM images of several 54×176 µm pixels within a 2×2 mm array (30×10 pixels). The equivalent circuit usable for a single active pixel, shown in FIG. 9c, can include one switching transistor (T1), two driving transistors (T2 and T3) and one storage capacitor ($C_{st}$). Using optimized layout design, the transparent driving and switching NWTs regions can allow significant reductions in the area of the transistor circuitry. FIG. 9d shows an FE-SEM image of representative $In_2O_3$ nanowires which are connected between S-D electrodes. In the embodiments shown, the ITO gate overlaps with the ITO S-D electrodes to ensure gating of the full length of the nanowire channel, thereby improving transistor performance. Twenty device regions were observed by FE-SEM, and the number of $In_2O_3$ nanowires connected between source and drain electrodes on the switching and driving transistors of each pixel were between 4 and 8, with an average value of 6. The diameters of the $In_2O_3$ nanowires were between 40 and 50 nm, and the channel lengths distance between S-D electrodes, along axis of each nanowire were between 1.2 and 1.6 µm, respectively.

Figure 10:
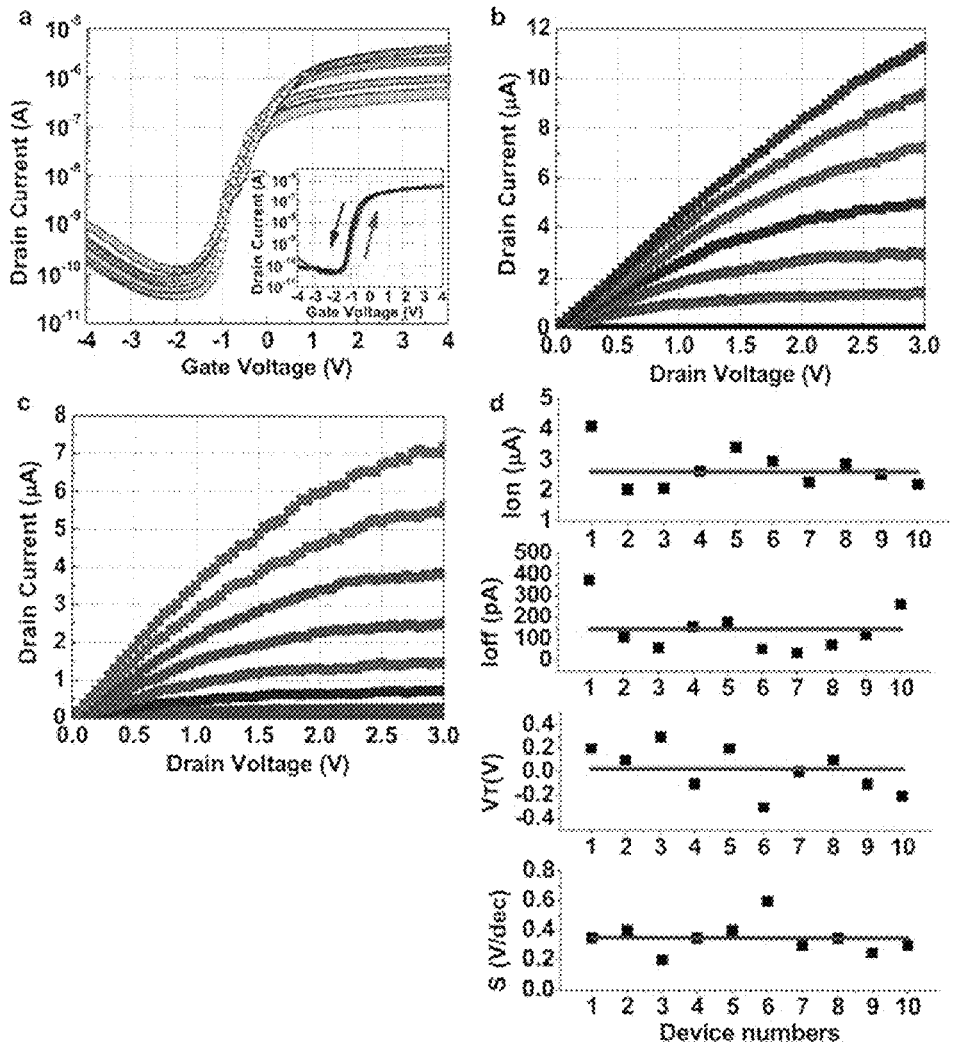
FIG. 10a shows the $I_{ds}$-$V_{gs}$ characteristics (log scale) of a representative $In_2O_3$ NWT (D/L~50 nm/1.5 μm) analogous to the one illustrated in FIG. 9a, with red (1), blue (2), green (3), dark blue (4) data points corresponding to $V_{ds}$=0.1, 0.2, 0.5 and 1.0 V. The inset shows the hysteresis of the representative device at $V_{ds}$=0.1 V.
FIG. 10b shows the $I_{ds}$-$V_{ds}$ characteristics for the representative device, with $V_{gs}$ varying from 0.0 V to 3.0 V in 0.5 V steps.
FIG. 10c shows the output current-voltage characteristics for a single-pixel circuit consisting of one switching transistor and two driving transistors ($I_{ds}$ versus $V_{ds}$ for the parallel combination of T2 and T3) for various steps in "data" line voltage (2 V on scan line to fully turn-on T1, 0.0 V to 4.0 V on data line in 0.5 V steps).
FIG. 10d shows the $I_{on}$, $I_{off}$, $V_T$ and S values of 10 representative NWT devices, with red lines indicating the average values for the respective parameters.

FIG. 10 shows the measured current-voltage (I-V) characteristics of representative NWTs. The design of these patterns, including width and length, are exactly same as those of the NWT circuits in the pixel array, except for the addition of extended contact pads for electrical probing. To improve transistor performance, several surface treatments were performed: i) following deposition of nanowires, plasma ashing was performed for 90 seconds in Ar and $O_2$ ambient on only the S-D contact region of nanowires (active regions of nanowires were covered by photoresist); and ii) after ITO metal deposition, active regions of NWTs were subjected to an ozone treatment for 1 minute to remove defects and contamination on the nanowire surface, and change the relative work functions of $In_2O_3$ and ITO S-D metals. The electron affinity of $In_2O_3$, $\chi_{In2O3}$, was 3.7 eV and a surface Fermi level position of $E_F-E_V=3.0$ eV, yielding an effective work functions $\Phi_{In2O3}=4.54$ eV for n-type material. Based on the work function of ITO ($\Phi_{ITO}=4.9$ eV), it is expected that ITO S-D contacts form relatively low barrier height interfaces to n-type $In_2O_3$. After these process treatments, the device performance of transistor characteristics in terms of $I_{on}/I_{off}$, S, and $V_T$ was improved significantly.

FIG. 10a shows a family of drain current versus gate-source voltage ($I_{ds}$-$V_{gs}$) characteristics for a representative NWT. The tested $In_2O_3$ NWTs exhibited an $I_{on}$ of ~1 µA (at $V_{gs}=3.0$ V, $V_{ds}=0.1$ V), an $I_{on}/I_{off}$ of $10^{-5}$, a $V_T$ of 0.1 V, an S value of 0.25 V/dec, and a $\mu_{eff}$ of ~258 $cm^2V^{-1}s^{-1}$, respectively. The mobility of SAND-based $In_2O_3$ NWTs devices according to the present teachings, therefore, was observed to be compatible or higher than the recently reported results for $In_2O_3$ nanowires (electron mobility of 279.05 $cm^2V^{-1}s^{-1}$ and 98.1 $cm^2V^{-1}s^{-1}$, effective mobility 6.93 $cm^2V^{-1}s^{-1}$) and ideal single-crystal $In_2O_3$ bulk mobility (~160 $cm^2V^{-1}s^{-1}$).

Without wishing to be bound by any particular theory, the single crystal nature of the $In_2O_3$ nanowire is expected to allow high mobilities by decreasing scattering at the intergrain regions. In addition, the SAND dielectric has previously been found to be suitable for realizing relatively high performance in other oxide nanowires. The inset in FIG. 10a shows the hysteresis of the devices for bias sweeps from negative gate voltage ($V_g(-)$) to positive gate voltage ($V_g(+)$) and from $V_g(+)$ to $V_g(-)$. The hysteresis was modest over the bias range, which illustrates the high quality of the SAND gate dielectric and $In_2O_3$ NW materials, and indicates negligible charge trapping and detrapping in/on the SAND and at the nanowire/SAND interface.

FIG. 10d shows the $I_{on}$, $I_{off}$, $V_T$ and S characteristics of ten representative transistors, with the red lines indicated the average values. The average values of $I_{on}$, $I_{off}$, $V_T$ and S were 2.73 µA, 143 pA, 0.02 V and 0.35 V/dec, respectively (these values were extracted from $I_{ds}$-$V_{gs}$ curves at 0.1 $V_{ds}$). The drain current versus drain-source voltage ($I_{ds}$-$V_{ds}$) characteristics of representative $In_2O_3$ NWTs are shown in FIG. 10b. As can be seen from FIG. 10b, these representative $In_2O_3$ NWTs exhibited typical n-type transistor characteristics. The desirable features of these $In_2O_3$ transistors are illustrated by their high $I_{on}$~6 µA at $V_{ds}=2.0$ V, and $V_{gs}=2.0$ V, respectively. In order to operate the transistor circuit, 2.0 V was applied to fully turn on the gate of switching transistor (T1).

FIG. 10c shows the measured output current of the circuit ($I_{ds}$ of T2 and T3 in parallel) versus the output voltage ($V_{dd}$). The various curves correspond to various values of data line voltage (0 V to 4 V in 0.5 V steps). The steps in data line voltage correspond to changes in Vgs for the drive transistors (T2 and T3). The transistor circuit shows ~5 µA at $V_{dd}=2.0$ V and $V_{g2}=3.0$ V. The total capacitance on a unit pixel was calculated to be about 0.25 pF/cm². Of the 70 transistor circuits that were measured, more than 65 circuits were working uniformly, while 5 circuits showed low on-current levels compared with other transistor circuits. The NWTs circuits showed more than 90% yield.

The higher $\mu_{eff}$ and steeper S of SAND-based $In_2O_3$ NWTs can allow smaller transistor area and can support the requirements of fast switching transistors and high-speed transistors for NW-AMOLED. Faster switching could enable approaches such as direct digital drive of pixels, which would reduce the complexity of interface circuitry.

Figure 11:
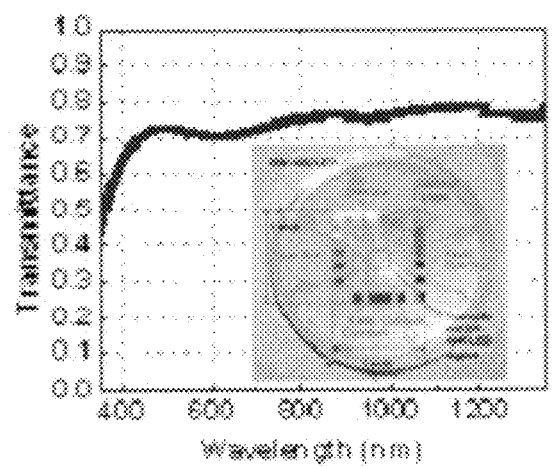
FIG. 11 shows the optical transmission spectrum for representative regions within an NWT channel of a 2×2 mm NW-AMOLED display element ($SiO_2$ (passivation)/ITO (source/drain)/$In_2O_3$ (active channel)/SAND (gate insulator)/ITO (gate)). The inset shows an image of a fully transparent NW-AMOLED substrate consisting of three 2×2 mm transistor arrays, 340 unit pixels, 80 test devices, 6 alignment marks, 20 test patterns, and contact pads.

The OLED parameters and target display specifications such as the peak RGB luminescence and efficiency, Commission Internationale de L'Eclairage Coordinates (CIE), and power consumptions dictate specific performance levels which must be considered in the design/simulation/extraction of the transistor current levels and minimum storage capacitor size. In order to extract the required current levels sufficient to operate an NW-AMOLED, the target values are as follows: i) target peak luminescence of 300 cd/m$^2$l; ii) target color coordinates of red (0.65, 0.34), green (0.27, 0.63), blue (0.14, 0.16), and white (0.31, 0.32); and iii) EL efficiency of 6 cd/A (red at 300 cd/m2), 23 cd/A (green at 600 cd/m2), and 6 cd/A (blue at 200 cd/m2). Note that a unit pixel size is 54×176 µm, the EL opening area on a unit pixel is 20×106 µm, an aperture ratio is 46%, and polarizer transmission is 40%. As a result, the driving transistors on RGB pixels should provide at least ~2.44 µA on a unit red pixel, ~1.01 µA on a unit green pixel, and ~1.46 µA on a unit blue pixel, respectively. This shows that the current level of SAND-based $In_2O_3$ NWTs (~5 uA on $V_{dd}$=2.0 V and $V_{g2}$=3.0 V) should be sufficient to drive a 54×176 µm pixel at 300 cd/m$^2$ in current-generation EL device technologies. While poly-Si TFT AMOLED devices can also provide the required drive currents, they require relatively large areas and have relatively low operating voltages. The resolution of the present NWT-integrated arrays is similar to that of a Quarter eXtended Graphics Array (QXGA: resolution of 2048×1536) of a 12-inch display. FIG. 11 shows the optical transmission spectra through the 2×2 mm nanowire-based region usable for AM-OLED. The optical transmission was measured to be about 72% in the 350 nm-1350 nm wavelength range. The inset shows a photographic image of the 1×1 inch glass substrate which consists of three 2×2 mm transistor arrays, 340 unit pixels, 80 test NWT devices, 6 alignment marks, 20 test patterns, and contact pads.

The following examples are provided to illustrate further and to facilitate the understanding of the present teachings and are not in any way intended to limit the invention.

EXAMPLE 1

Fabrication of $In_2O_3$ and ZnO NWT Devices with $Al_2O_3$ as the Gate Insulator A 500 nm thick layer of $SiO_2$ was deposited by plasma-enhanced chemical vapor deposition (PECVD) on Corning 1737 glass substrates and served as a buffer and planarization layer. Individual gate electrodes were formed by sputtering IZO ($R_{sheet}$=40Ω/□) and by ion-assisted deposition (IAD) at room temperature ($R_{sheet}$=60Ω/□) and subsequent patterning by photolithography and etching. An 18 nm thick layer of $Al_2O_3$ was then deposited using atomic layer deposition (ALD) at 300° C. in an ASM Microchemistry F-120 ALCVD™ system using trimethyl aluminum ($Al(CH_3)_3$) (TMA) and water as precursors. Following $Al_2O_3$ deposition, the substrates were annealed at 500° C. for 30 seconds under $N_2$ to improve the film quality. Next, a suspension of $In_2O_3$ or ZnO nanowires in VLSI grade 2-propanol solution was disbursed on the gate-patterned substrates. Single-crystal semiconducting $In_2O_3$ nanowires were synthesized by a pulsed laser ablation process (see Li, C. et al., *Adv. Mater.*, 15: 143-145 (2003)), with average diameter and length of 20 nm and 5 µm, respectively. Powdered ZnO nanowires synthesized by thermal evaporation and condensation were purchased from Nanolab Inc. The average diameter and length were 120 nm and 5 µm, respectively, and microstructural characterization indicated that they were highly crystalline (see Banerjee, D. et al. *Nanotechnology*, 15: 404-409 (2004)). Finally, ITO source/drain electrodes were deposited by IAD at room temperature and patterned by photolithography. Following source/drain electrode patterning, the NWTs, while shielded from UV light, were subjected to an ozone treatment (UV-Ozone cleaner, UVO 42-220, Jelight Co. Ltd.) for 2 minutes to achieve optimum transistor performance in terms of $I_{on}$, $I_{on}$:$I_{off}$, S, and $\mu_{eff}$. The ozone environment was obtained by setting the oxygen content to 50 ppm, the UV wavelength to 184.9 nm and UV lamp power to 28 milliwatts per cm$^2$ at 254 nm. Fully transparent and flexible $In_2O_3$ NWT devices using PET (Melinex, DuPont) also were fabricated with a PET/ITO(G)/$Al_2O_3$/$In_2O_3$ nanowire/ITO(S/D) structure (FIG. 5a). The 50 nm thick layer of $Al_2O_3$ layer was deposited at 200° C. ITO for the gate and source/drain electrodes was deposited by IAD. The lengths of the nanowires of given transistors between source and drain were obtained from the FE-SEM images, and accounted for the angle between the nanowire and the electrode edges.

EXAMPLE 2

Fabrication of $In_2O_3$ NWT Devices with SAND as the Gate Insulator

The 200 nm thick layer of $SiO_2$ was deposited on Corning 1737A glass substrates as a buffer layer for planarization. The 100 nm thick ITO thin film was deposited by IAD at room temperature ($R_{sheet}$=60 ohms per square), and subsequently patterned by photolithography for individually addressed bottom gate electrodes. A 24 nm thick layer of SAND was then deposited on the patterned ITO gate metals using a self-assembly method. Following SAND deposition, contact holes were patterned for anode opening for electroluminescence and bottom gate electrode contacts on the pixel. Next, a suspension of $In_2O_3$ nanowires in VLSI grade 2-propanol solution was disbursed on the device substrates. Single-crystal semiconducting $In_2O_3$ nanowires were synthesized by a pulsed laser ablation process, with average diameter and length of 50 nm and 5 µm, respectively. Al source/drain contacts were fabricated by spattering. In the case of ITO S-D electrodes, they were deposited by IAD at room temperature and patterned by lift-off method. Nanowires on the unnecessary regions were removed by ultrasonication except nanowires which were addressed between S-D electrodes. Following S-D electrode patterning, the NWTs, while shielded from UV light, were subjected to an ozone treatment using UV-Ozone cleaner for 1 minute to achieve optimum transistor performance in terms of $I_{on}$, $I_{on}$:$I_{off}$, S, and $\mu_{eff}$. After ozone treatment, the devices were passivated by depositing a 200 nm of e-beam evaporated $SiO_2$ as a passivation layer to planarize NWTs array for EL deposition.

EXAMPLE 3

Fabrication of $SnO_2$ NWT Devices with SAND as the Gate Insulator

A 200 nm thick $SiO_2$ layer was deposited on Si or Corning 1737A glass substrates as a buffer layer for planarization. A 100 nm thick ITO thin film was deposited by ion-assisted deposition (IAD) at room temperature ($R_{sheet}$=60 ohms per square), and subsequently patterned by photolithography for individually addressed bottom gate electrodes. A 15 nm thick layer of SAND was then deposited on the patterned ITO gate metals using a self-assembly method. Next, a suspension of SnO₂ nanowires in VLSI grade 2-propanol solution was disbursed on the device substrates. Al source/drain contacts were fabricated by spattering. ITO S-D electrodes were deposited by IAD at room temperature and patterned by a lift-off method. Nanowires on the unnecessary regions were removed by ultrasonication except nanowires which were addressed between S-D electrodes.

Figure 12:
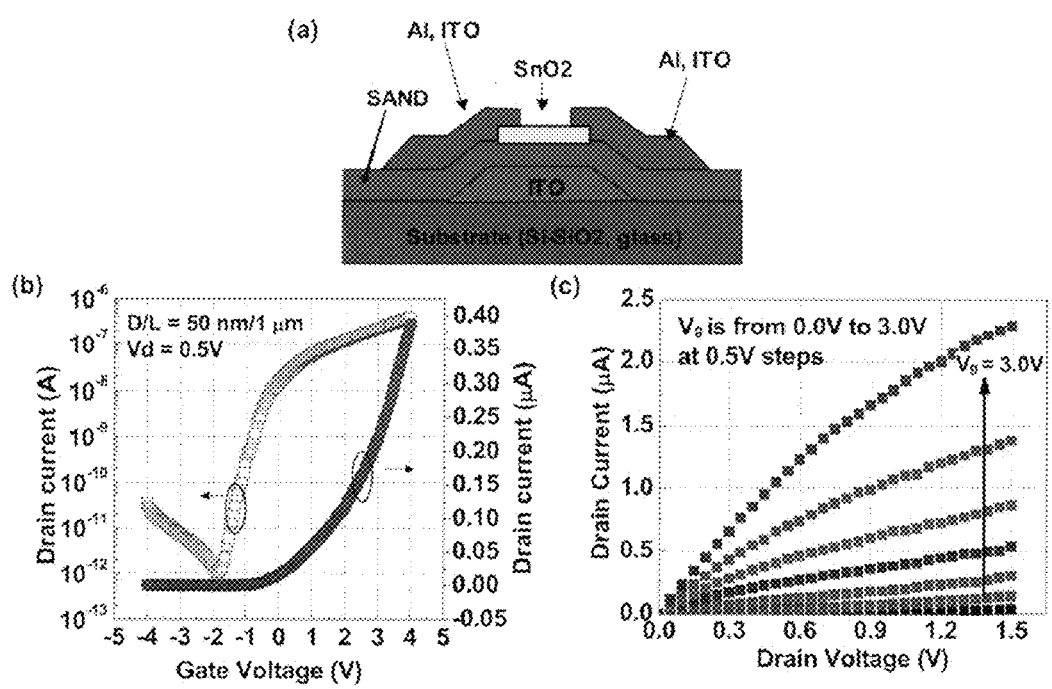

FIG. 12 shows the structure and electrical characteristic of a representative single SnO₂ NWT using SAND as the gate dielectric. Different substrates (Si—SiO₂, Glass-SiO₂) and source/drain contact (Al, ITO) materials were used. For these devices, typical performance before ozone treatment were: $S=0.1$-$0.4$ V/dec, $I_{on}/I_{off} \sim 10^5$-$10^6$, $V_T = \pm 0.2$ V, and $\mu_{eff}$ varied from ~15 to 30 cm²/V-sec over the gate bias range of 1 V to 4 V. Improved device performance is expected with ozone treatment and encapsulation.

EXAMPLE 4

Fabrication of Ge NWT Devices with SAND as the Gate Insulator

A 200 nm thick SiO₂ was deposited on Si or Corning 1737A glass substrates as a buffer layer for planarization. A 100 nm thick ITO thin film was deposited by ion-assisted deposition (IAD) at room temperature ($R_{sheet}=60$ ohms per square), and subsequently patterned by photolithography for individually addressed bottom gate electrodes. A 15 nm thick layer of SAND was then deposited on the patterned ITO gate metals using a self-assembly method. Next, a suspension of p- or n-type Ge nanowires in VLSI grade 2-propanol solution was disbursed on the device substrates. Al source/drain contacts were fabricated by spattering. ITO S-D electrodes were deposited by IAD at room temperature and patterned by a lift-off method. Nanowires on the unnecessary regions were removed by ultrasonication except nanowires which were addressed between S-D electrodes.

Figure 13:
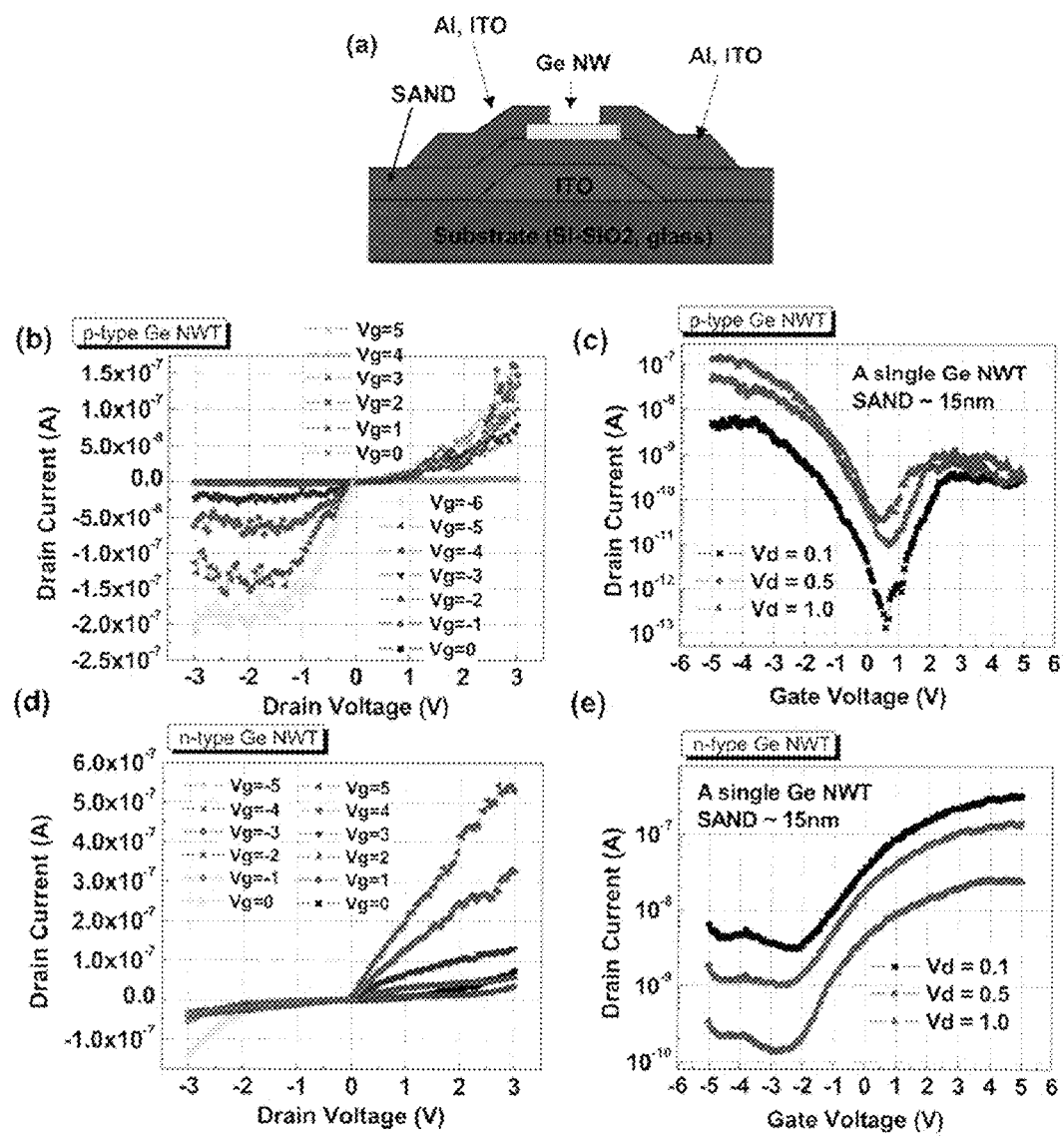

FIG. 13 shows the structure and electrical characteristic of representative single p-type and n-type Ge NWTs using SAND as the gate dielectric. Different substrates (Si—SiO₂, Glass-SiO₂) and source/drain contact (Al, ITO) materials were used. For the p-type Ge NWTs, typical performance before ozone treatment were: $S \sim 1$ V/dec, $I_{on}/I_{off} \sim 10^6$, $V_T=0$-($-1$) V, and $\mu_{eff} \sim 30$ to 50 cm²/V-sec over the gate bias range of $-1$ V to $-5$ V. For the n-type Ge NWTs, typical performance before ozone treatment were: $S \sim 1$ V/dec, $I_{on}/I_{off} \sim 10^4$-$10^5$, $V_T=0$-$1$ V, and $\mu_{eff} \sim 8$ to 12 cm²/V-sec over the gate bias range of $-1$ V to $+5$ V. Improved device performance is expected with ozone treatment and encapsulation.

Figure 14:
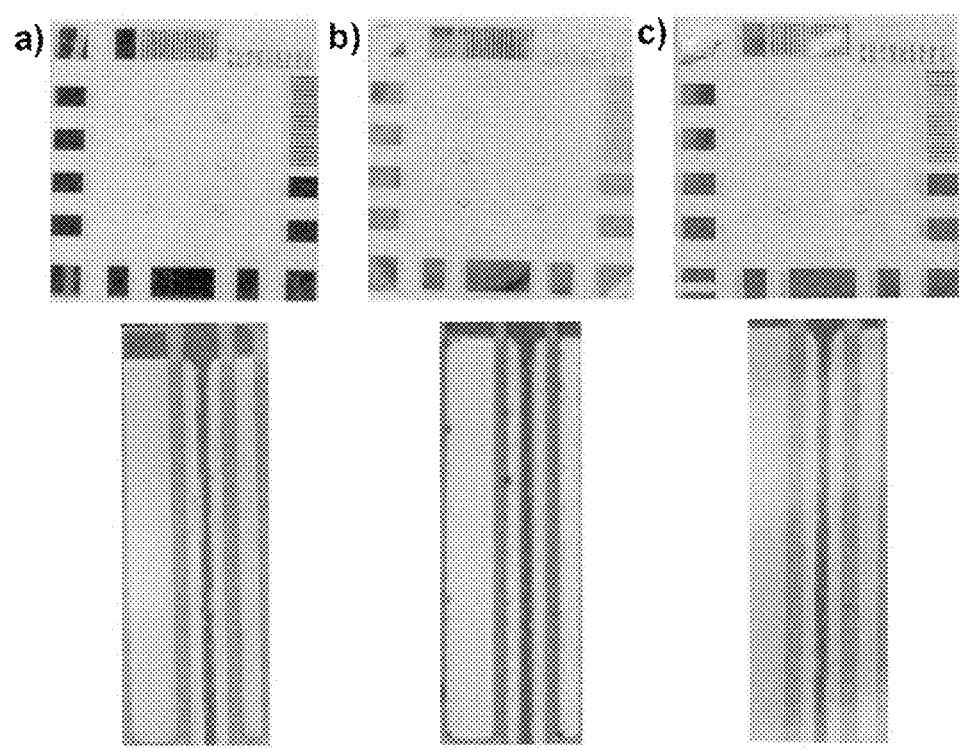
FIGS. 14a-c show photographic images of NW-AMOLED substrates (top row) and NWT channel regions (bottom row) according to the present teachings, specifically, in which the semiconducting nanowires are as follows: a) $In_2O_3$, b) $SnO_2$, and c) p-type Ge.

FIG. 14 shows photographic images of NW-AMOLED substrates (top row) and NWT channel regions (bottom row) according to the present teachings, specifically, in which the semiconducting nanowires are as follows: a) In₂O₃, b) SnO₂, and c) p-type Ge. The respective device structures consist of a glass-SiO₂ substrate, an ITO gate electrode, a SAND gate dielectric, ITO source/drain electrodes, and a single nanowire channel region of In₂O₃ (FIG. 14a), SnO₂ (FIG. 14b), or Ge (FIG. 14c). As shown in FIG. 14, the Ge-based devices have similar optical transparency compared to similar devices based on metal oxide nanowires.

EXAMPLE 5

Characterization Methodology

The work function of an as-grown ITO thin film was measured using an AC-2, RKI Instruments photoelectron spectrometer. The UV-Vis spectra were recorded with a Varian Cary 1E spectrophotometer. Electrical I-V measurements were performed using a Keithley 4200 semiconductor characterization system. The NWs within a device were imaged with a Hitachi S-4800 FE-SEM following electrical characterization.

EXAMPLE 6

Calculation of Mobility and Threshold Voltage

In contrast to planar transistors in which carrier concentration and mobility can be determined independently, e.g., through the Hall effect and conductivity measurements, the lack of extended lateral geometries in NWTs dictates an alternative approach for determining mobility. Following the typical approach from prior NWT studies, field effect mobilities ($\mu_{eff}$) were calculated using a combination of the cylinder-on-plate (COP) capacitance model $$C_i = \frac{2\pi\varepsilon_0 k_{eff} L}{\cosh^{-1}(1 + t_{ox}/r)}$$

and the relationship $$\mu = \frac{dI_{ds}}{dV_{gs}} \times \frac{L^2}{C_i} \times \frac{1}{V_{ds}}$$

obtained from the MOSFET linear region model (see Wang, D. et al., *Appl. Phys. Lett.*, 83: 2432-2434 (2003)), where $k_{eff} \sim 9.0$ is the effective dielectric constant of Al₂O₃, L is the channel length of the NWTs (~1.80 µm for In₂O₃ NW, ~1.66 µm for ZnO NW), where $\mu_{eff} \sim 9.0$ is the effective dielectric constant of Al₂O₃, L is the channel length of the NWTs (~1.80 µm for In₂O₃ NW, ~1.66 µm for ZnO NW), r is the radius of the NWTs (10 nm for In₂O₃ NR, 60 nm for ZnO NW), $t_{ox} \sim 18$ nm is the thickness of gate insulator, $dI_{ds}/dV_{gs}$ is the transconductance, and $V_{ds}$ is drain voltage. In the case of flexible and transparent In₂O₃ NWTs, L~1.79 µm and r~10 nm were used. The geometry of certain devices disclosed herein consisted of the gate dielectric ($k_{eff} \sim 9$) below and air ($k_{eff} \sim 1$) above the nanowire. A prior comparision (see Vashaee, D. et al., *J. Appl. Phys.*, 99: 54310-1-5 (2006)) between electrostatic simulations and an analytic formula for capacitance (a form of the COP equation valid for $t_{ox} \gg r$.) for a comparable geometry with SiO₂/air showed good agreement between the two capacitances over a range of $t_{ox}/r$ from 8 to 40, provided that a value of $k_{eff}=0.5\varepsilon_{R1SiO2}$ was used. Because the geometry of the tested devices used a higher k dielectric constant and smaller $t_{ox}/r$ (~1.8), the fringing fields were more tightly confined to the gate dielectric layer. Accordingly, a value of $k_{eff} \sim \varepsilon_{R1Al2O3}$ was chosen, which would tend to overestimate the capacitance (as the appropriate correction factor is greater than 0.5 but less than 1.0), and therefore underestimate the mobility. The transconductances shown in FIGS. 3a, 3b and 4d have been smoothed by polynomial fit to 3 orders with 20 points fit to the curve. In order to extract $V_T$, the extrapolated $$V_T(V_T = V_G(g_{m\_max}) - \frac{I_D(g_{m\_max})}{g_{m\_max}}$$

where $$g_m = \frac{\partial I_D}{\partial V_G}$$

(at $V_d$=0.5V)) was used as it gives an accurate $V_T$. The gate voltage at the maximum $g_m$ ($V_g(g_{m\_max})$), the drain current at the maximum $g_m$, $I_d(g_{m\_max})$, and the maximum $g_m$ ($g_{m\_max}$)

were obtained from FIGS. 3a, 3c and 5d. These values were confirmed with $V_T$ values obtained from the $I_{ds}$-$V_{ds}$ curve at $V_d$=0.1 V.\

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

What is claimed is:

1. A nanowire transistor device comprising:
    one or more semiconducting nanowires extending between a source electrode and a drain electrode, and
    a gate dielectric in contact with the one or more nanowires, wherein each of the gate dielectric, the source electrode and the drain electrode is transparent, and
    wherein the gate dielectric comprises a multi-layer composition, the multi-layer composition comprising periodically alternating layers, wherein the alternating layers comprise one or more layers comprising a polarizable moiety, and one or more layers comprising a silyl or siloxane moiety.

2. A nanowire transistor device comprising:
    one or more semiconducting nanowires extending between a source electrode and a drain electrode, and
    a gate dielectric in contact with the one or more nanowires, wherein each of the gate dielectric, the source electrode and the drain electrode is transparent, and
    wherein each of the source electrode and the drain electrode independently comprises indium tin oxide, indium zinc oxide, indium oxide, zinc oxide, zinc indium tin oxide, fluorinated tin oxide, gallium zinc oxide, gallium indium oxide, or gallium indium tin oxide.

3. A nanowire transistor device comprising:
    one or more semiconducting nanowires extending between a source electrode and a drain electrode, and
    a gate dielectric in contact with the one or more nanowires, wherein each of the gate dielectric, the source electrode and the drain electrode is transparent, and
    wherein the transparent gate electrode is defined under the gate dielectric and comprises indium tin oxide, indium zinc oxide, indium oxide, zinc oxide, zinc indium tin oxide, fluorinated tin oxide, gallium zinc oxide, gallium indium oxide, or gallium indium tin oxide.

4. The device of claim 2, wherein the one or more semiconducting nanowires comprise one or more elements selected from Group 12, Group 13, Group 14, Group 15 and Group 16.

5. The device of claim 4, wherein the one or more semiconducting nanowires are selected from p-type Ge nanowires and n-type Ge nanowires.

6. The device of claim 2, wherein the one or more semiconducting nanowires comprise a transparent metal oxide.

7. The device of claim 6, wherein the one or more metal oxide nanowires are selected from ZnO nanowires, $In_2O_3$ nanowires, and $SnO_2$ nanowires.

8. The device of claim 2, wherein the nanowire transistor comprises a single semiconducting nanowire.

9. The device of claim 2, wherein the nanowire transistor comprises a plurality of semiconducting nanowires.

10. The device of claim 2, wherein the gate dielectric comprises one or more transparent metal oxides.

11. The device of claim 1, wherein the polarizable moiety comprises a stilbazonium group.

12. The device of claim 1, wherein at least some of the alternating layers are coupled to an adjacent layer by a coupling layer comprising a siloxane matrix.

13. The device of claim 12, wherein at least some of the alternating layers are coupled to one another or the siloxane matrix via a condensation reaction.

14. The device of claim 1, wherein at least some of the alternating layers comprise a condensation product of a silane-substituted stilbazolium compound and a trisiloxane compound.

15. The device of claim 1, wherein the alternating layers comprise one or more layers comprising a sigma moiety.

16. The device of claim 15, wherein at least some of the alternating layers comprise a condensation product of a bis (silyl)-$C_4$- about $C_{10}$ alkyl compound and a trisiloxane compound.

17. The device of claim 2, wherein the gate dielectric comprises a crosslinked polymeric material.

18. The device of claim 2 comprising a transparent gate electrode defined under the gate dielectric.

19. The device of claim 2, wherein the gate dielectric is deposited on a transparent substrate.

20. The device of claim 19, wherein the transparent substrate is glass or plastic.

21. An array comprising a device of claim 2.

22. An electronic circuit comprising the array of claim 21.

23. The device of claim 1, wherein the one or more semiconducting nanowires are selected from p-type Ge nanowires and n-type Ge nanowires.

24. The device of claim 1, wherein the one or more semiconducting nanowires are selected from ZnO nanowires, $In_2O_3$ nanowires, and $SnO_2$ nanowires.

25. The device of claim 2, wherein the gate dielectric comprises a multi-layer composition, the multi-layer composition comprising periodically alternating layers, wherein the alternating layers comprise one or more layers comprising a polarizable moiety, and one or more layers comprising a silyl or siloxane moiety.

26. The device of claim 18, wherein the transparent gate electrode comprises indium tin oxide, indium zinc oxide, indium oxide, zinc oxide, zinc indium tin oxide, fluorinated tin oxide, gallium zinc oxide, gallium indium oxide, or gallium indium tin oxide.

27. The device of claim 3, wherein the one or more semiconducting nanowires are selected from p-type Ge nanowires, n-type Ge nanowires, ZnO nanowires, $In_2O_3$ nanowires, and $SnO_2$ nanowires.

* * * * *

UNITED STATES PATENT AND TRADEMARK OFFICE
CERTIFICATE OF CORRECTION

PATENT NO.         : 7,910,932 B2                                      Page 1 of 1
APPLICATION NO.    : 12/131697
DATED              : March 22, 2011
INVENTOR(S)        : Marks et al.

It is certified that error appears in the above-identified patent and that said Letters Patent is hereby corrected as shown below:

Column 1, Lines 11-17:

"The invention, in part, was made with government support under Grant No. NCC-2-1363 awarded by the National Aeronautics and Space Administration Institute for Nanoelectronics and Computing to Northwestern University. The United States Government may have certain rights in this invention." should be --This invention was made with government support under grant number DMR0520513 awarded by the National Science Foundation and grant number NCC-2-1363 awarded by the National Aeronautics and Space Administration. The government has certain rights in the invention.--

Column 14, Line 7 "functions" should be --function--

Column 18, Line 32 "NR" should be --NW--

Signed and Sealed this
Sixth Day of September, 2011

David J. Kappos
*Director of the United States Patent and Trademark Office*